United States Patent
Lee et al.

(10) Patent No.: US 10,109,665 B2
(45) Date of Patent: Oct. 23, 2018

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventors: Ho-Jin Lee, Seoul (KR); Kwangjin Moon, Hwaseong-si (KR); Seokho Kim, Hwaseong-si (KR); Sukchul Bang, Yongin-si (KR); Jin Ho An, Seoul (KR); Naein Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/630,063

(22) Filed: Jun. 22, 2017

(65) Prior Publication Data

US 2018/0053797 A1    Feb. 22, 2018

(30) Foreign Application Priority Data

Aug. 17, 2016   (KR) .......................... 10-2016-0104475

(51) Int. Cl.
 *H01L 27/146*    (2006.01)

(52) U.S. Cl.
 CPC .... *H01L 27/1463* (2013.01); *H01L 27/14621* (2013.01); *H01L 27/14627* (2013.01); *H01L 27/14636* (2013.01); *H01L 27/14645* (2013.01); *H01L 27/14683* (2013.01)

(58) Field of Classification Search
 CPC ........... H01L 27/1463; H01L 27/14621; H01L 27/14627; H01L 27/14636; H01L 27/14645; H01L 27/14683
 USPC ........................................................ 257/446
 See application file for complete search history.

(56) References Cited

U.S. PATENT DOCUMENTS

| | | | |
|---|---|---|---|
| 8,299,624 B2 | 10/2012 | Matsuo | |
| 8,546,953 B2 | 10/2013 | Hornj et al. | |
| 8,742,535 B2 | 6/2014 | Bachman et al. | |
| 8,907,493 B2 | 12/2014 | Uchida et al. | |
| 9,240,348 B2 | 1/2016 | Yang | |
| 2013/0001793 A1* | 1/2013 | Yu | H01L 21/76898 257/774 |
| 2013/0285125 A1* | 10/2013 | Chen | H01L 24/13 257/288 |
| 2014/0008757 A1* | 1/2014 | Ramachandran | H01L 23/49827 257/506 |
| 2015/0155223 A1 | 6/2015 | Nomachi | |
| 2015/0279825 A1 | 10/2015 | Kang et al. | |
| 2017/0047270 A1 | 2/2017 | Lee et al. | |

(Continued)

FOREIGN PATENT DOCUMENTS

| | | |
|---|---|---|
| KR | 2015/0112112 A | 10/2015 |
| KR | 2017/0020662 A | 2/2017 |
| KR | 20170086924 A | 7/2017 |

*Primary Examiner* — Tu-Tu Ho
(74) *Attorney, Agent, or Firm* — Harness, Dickey, & Pierce, P.L.C.

(57) ABSTRACT

A semiconductor device includes a semiconductor substrate with first and second surfaces facing each other, an etch stop pattern in a trench formed in the first surface of the semiconductor substrate, a first insulating layer on the first surface of the semiconductor substrate, and a through via penetrating the semiconductor substrate and the first insulating layer. The etch stop pattern surrounds a portion of a lateral surface of the through via.

15 Claims, 30 Drawing Sheets

(56) References Cited

U.S. PATENT DOCUMENTS

2017/0207158 A1 7/2017 Kang et al.

* cited by examiner

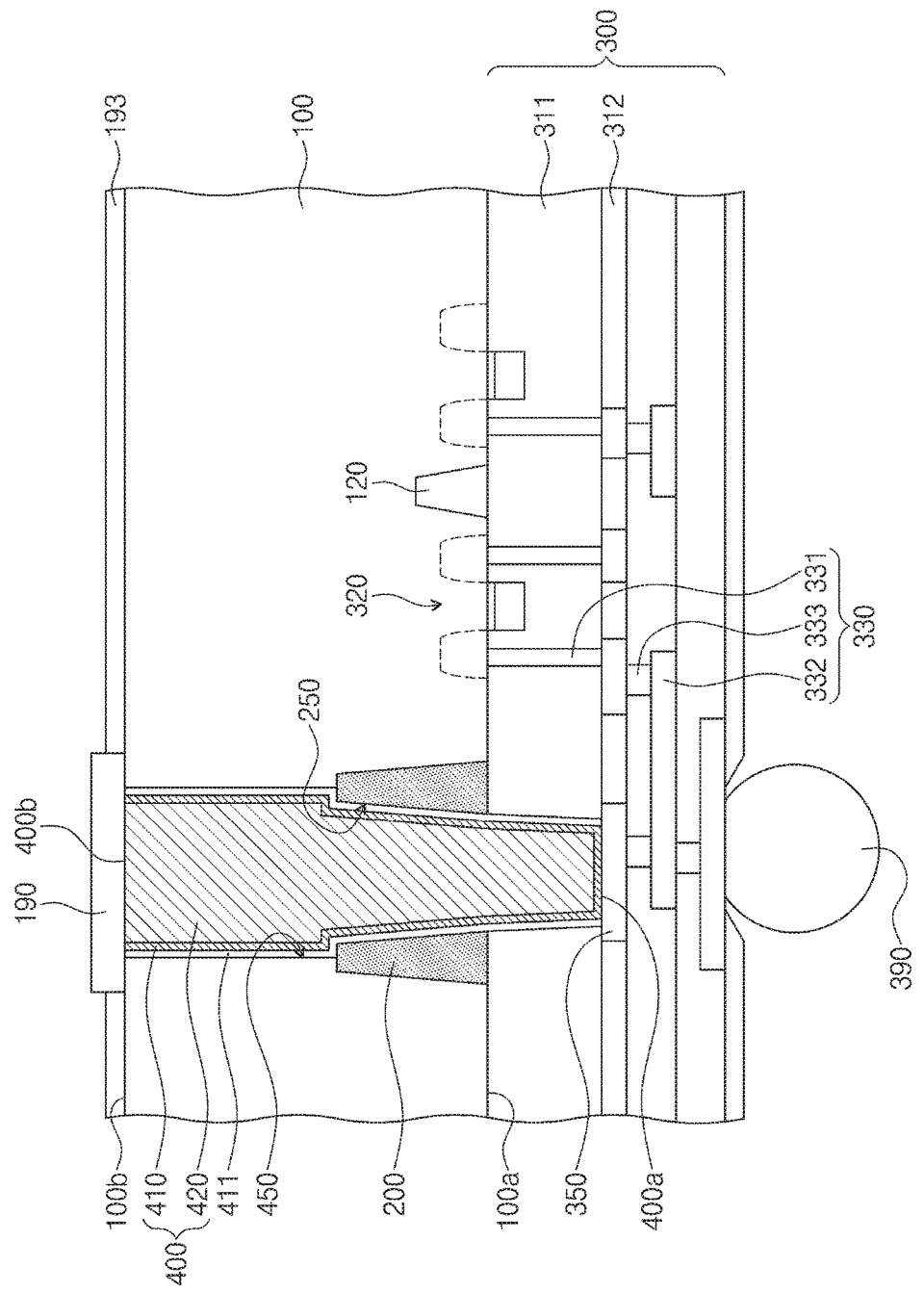

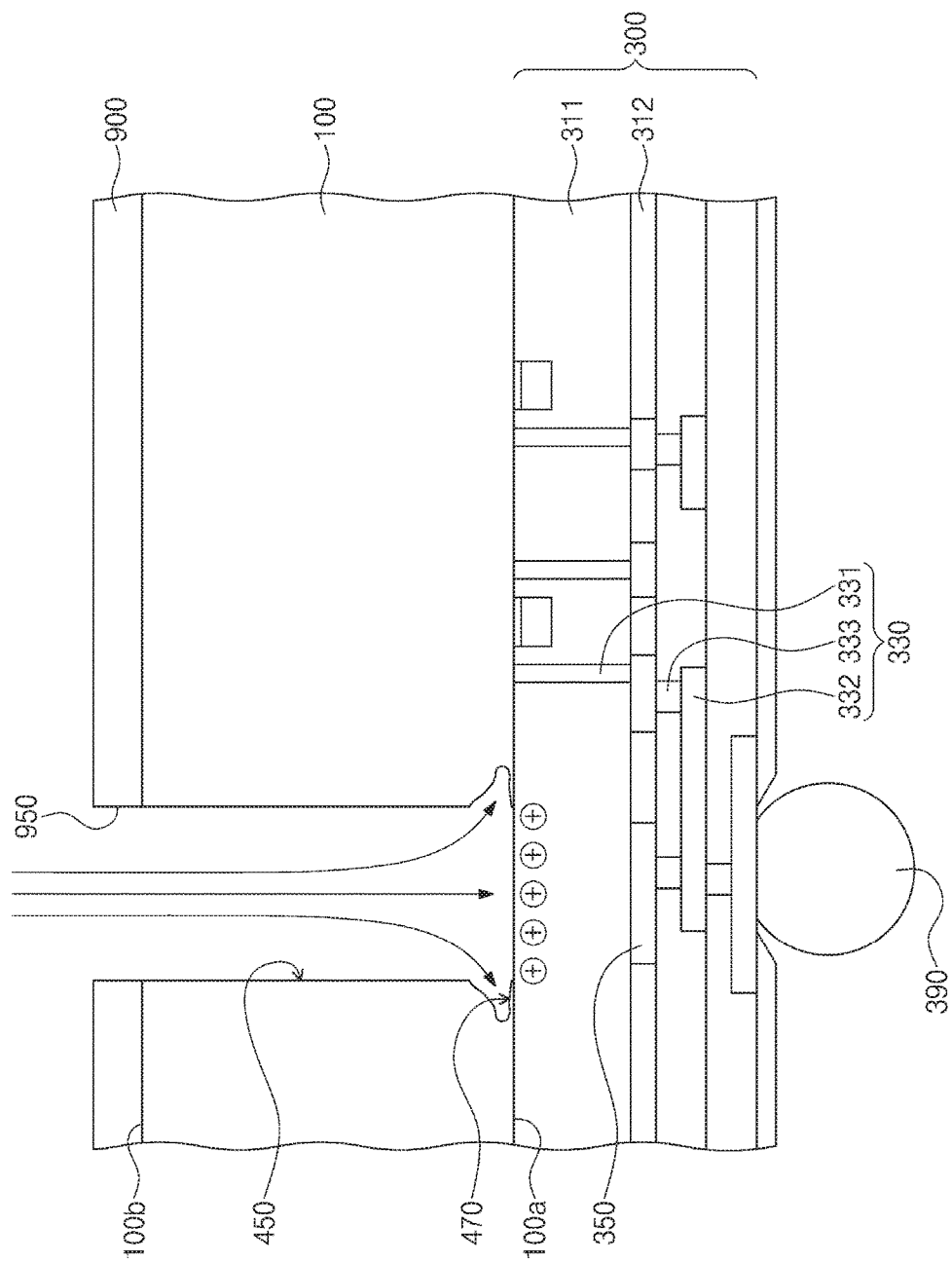

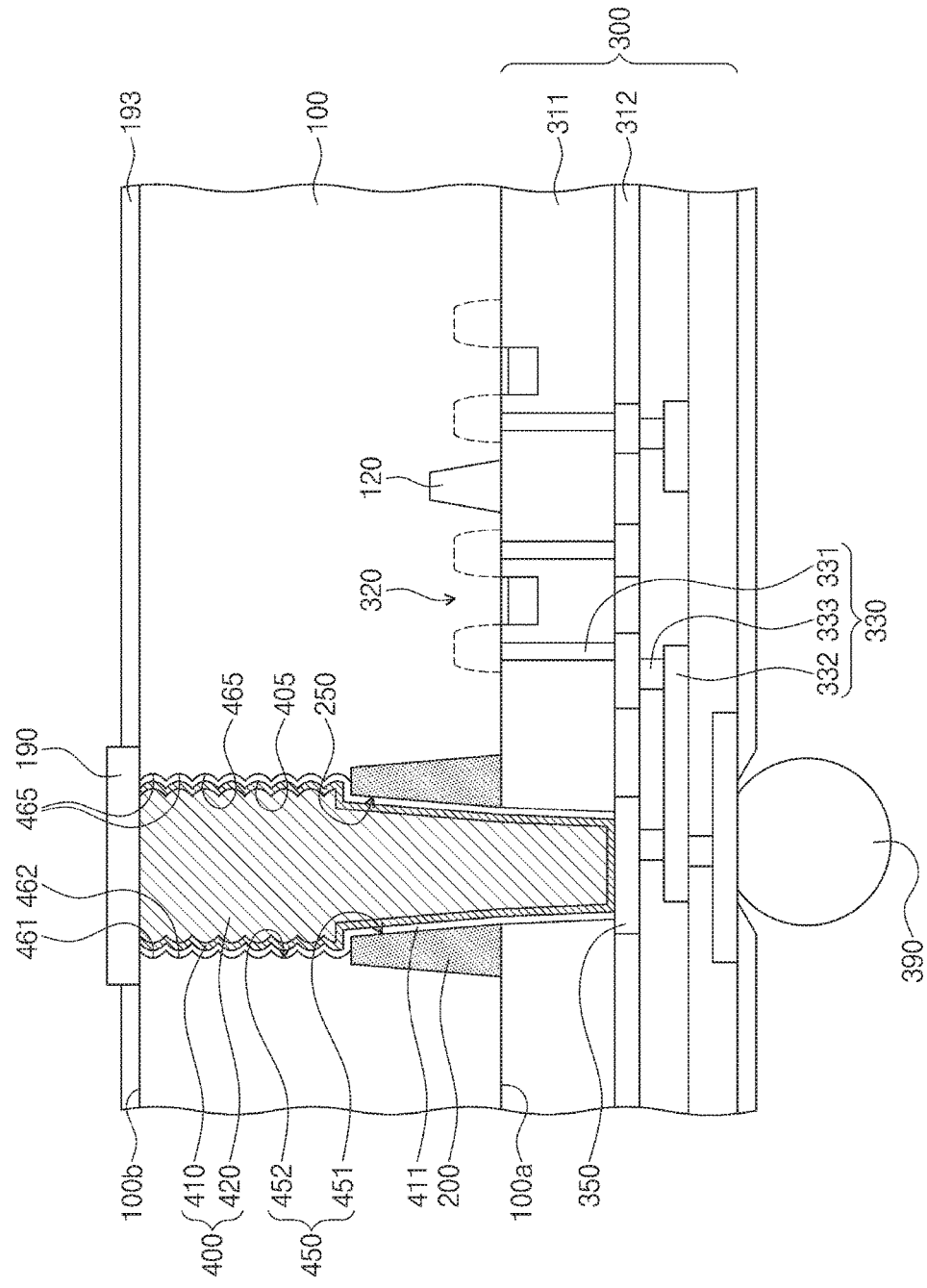

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2016-0104475, filed on Aug. 17, 2016, in the Korean Intellectual Property Office, the entire contents of which are hereby incorporated by reference.

BACKGROUND

1. Field

Some example embodiments of the present disclosure relate to a semiconductor device and a method of fabricating the same, and in particular, to a semiconductor device with a through via and a method of fabricating the same.

2. Description of the Related Art

A semiconductor device may be electrically connected to another semiconductor device or a printed circuit board by a through via. The use of the through via makes it possible to realize a three-dimensionally stacked package structure and to obtain an increased data-transfer speed, compared with a conventional package structure using solder balls or solder bumps. For integration density of a semiconductor device, developing a through via with physically and electrically reliable characteristics may be necessary.

SUMMARY

Some example embodiments of the inventive concepts provide a highly-reliable semiconductor device and a method of fabricating the same.

According to some example embodiments of the inventive concepts, a semiconductor device includes a semiconductor substrate having first and second surfaces facing each other, an etch stop pattern in a trench formed in the first surface of the semiconductor substrate, a first insulating layer on the first surface of the semiconductor substrate, and a through via penetrating the semiconductor substrate and the first insulating layer. The etch stop pattern surrounds a portion of a lateral surface of the through via.

According to some example embodiments of the inventive concepts, a semiconductor device includes a semiconductor layer, an etch stop pattern penetrating the semiconductor layer, a through via in a hole defined by the etch stop pattern, a portion of a lateral surface of the through via being surrounded by the etch stop pattern, and a circuit layer on a surface of the semiconductor layer, the circuit layer covering the etch stop pattern.

According to some example embodiments of the inventive concepts, a method of fabricating a semiconductor device includes providing a substrate including a semiconductor substrate including first and second surfaces facing each other, a first insulating layer on the first surface of the semiconductor substrate, and an etch stop pattern in the semiconductor substrate, the etch stop pattern including a hole therein, and etching the semiconductor substrate to form a through hole in the hole of the etch stop pattern to expose an inner side surface of the etch stop pattern.

According to some example embodiments of the inventive concepts, a semiconductor device includes an etch stop pattern in a semiconductor substrate, and a through via penetrating the semiconductor substrate and extending into the etch stop pattern, the through via having the etch stop pattern along sidewalls of a lower portion of the through via.

BRIEF DESCRIPTION OF THE DRAWINGS

Some example embodiments will be more clearly understood from the following brief description taken in conjunction with the accompanying drawings.

FIGS. 3A to 3E are sectional views illustrating a method of fabricating a semiconductor device, according to some example embodiments of the inventive concepts.

FIGS. 4A and 4B are sectional views illustrating a method of fabricating a semiconductor device, according to some example embodiments of the inventive concepts.

FIGS. 6A to 6D are sectional views illustrating a method of fabricating a semiconductor device, according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
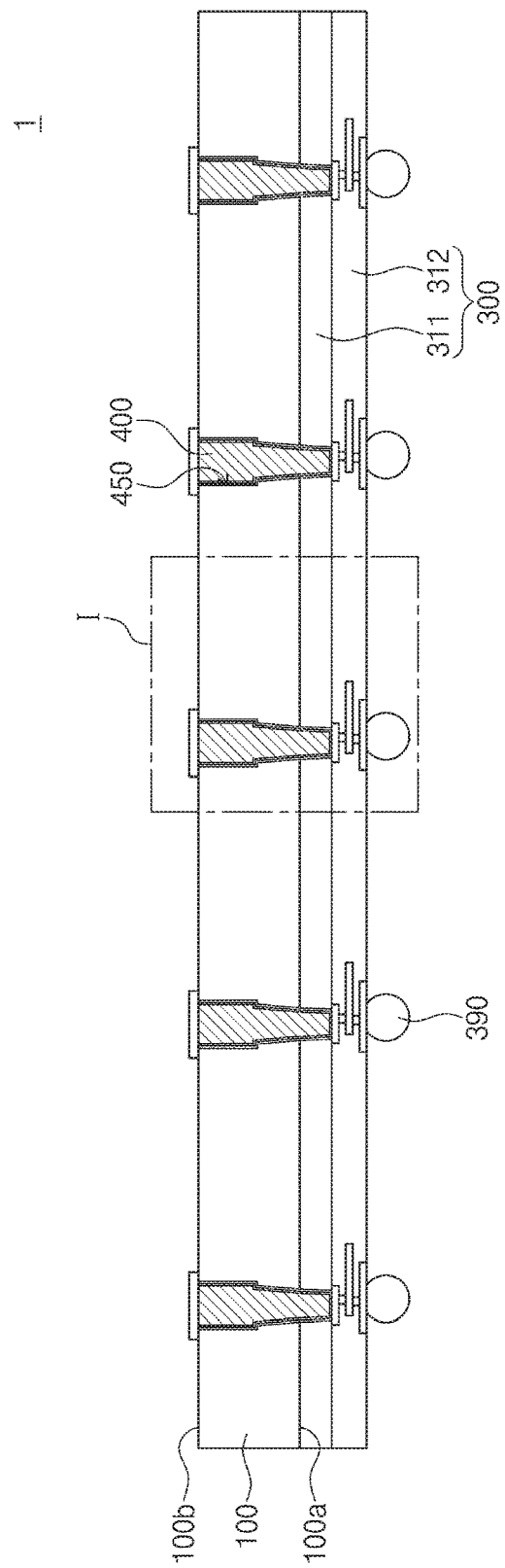
FIG. 1 is a sectional view illustrating a semiconductor device according to some example embodiments of the inventive concepts.

FIG. 1 is a sectional view illustrating a semiconductor device according to some example embodiments of the inventive concepts.

Referring to FIG. 1, a semiconductor device 1 may include a semiconductor substrate 100, a circuit layer 300, and a through via 400. The semiconductor device 1 may be a memory chip, a logic chip, or a semiconductor chip including both of memory and logic elements. The semiconductor substrate 100 may be a wafer-level or chip-level substrate. The semiconductor substrate 100 may be formed of or include silicon, germanium, or silicon germanium. The semiconductor substrate 100 may have a first surface 100a and a second surface 100b facing each other. The second surface 100b of the semiconductor substrate 100 may be parallel to the first surface 100a, but the inventive concepts are not limited thereto. The circuit layer 300 may be provided on the first surface 100a of the semiconductor substrate 100. The circuit layer 300 may include a first insulating layer 311 and a second insulating layer 312.

The through via 400 may be formed in a through hole 450 penetrating the semiconductor substrate 100 and may penetrate at least a portion of the circuit layer 300. For example, the through via 400 may be formed to penetrate the semiconductor substrate 100 and the first insulating layer 311. A connection terminal 390 may be provided on a bottom surface of the circuit layer 300. The connection terminal 390 may include a solder ball. The connection terminal 390 may be formed of or include a conductive material (e.g., metal). The connection terminal 390 may be electrically connected to the through via 400. In the present specification, the expression "electrically connected or coupled" may mean that a plurality of elements are directly connected/coupled to each other or are indirectly connected or coupled to each other via another conductive element. The through via 400 and the connection terminal 390 may provide a signal path for electrical signals to be transferred to or from the semiconductor device 1. Hereinafter, the through via 400 and a method of fabricating the same will be described in more detail.

Figure 2:
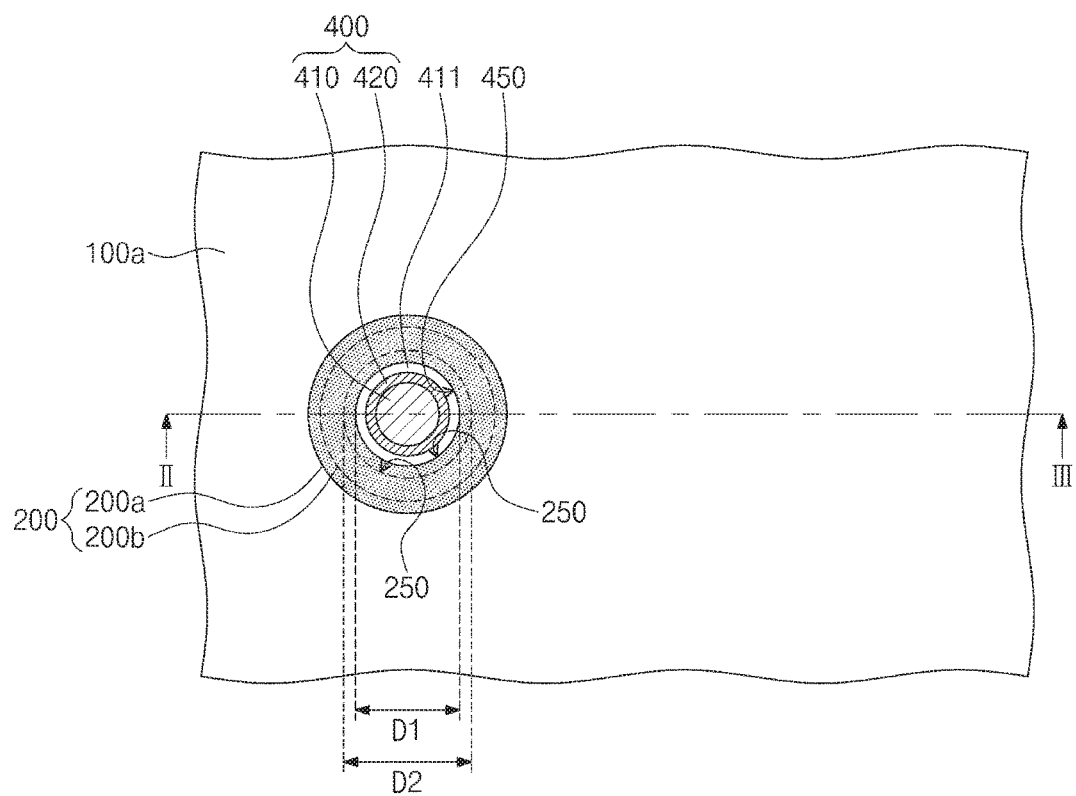
FIG. 2 is a plan view illustrating an etch stop pattern according to some example embodiments of the inventive concepts.

FIG. 2 is a plan view illustrating an etch stop pattern according to some example embodiments of the inventive concepts. FIGS. 3A to 3E are sectional views illustrating a method of fabricating a semiconductor device, according to some example embodiments of the inventive concepts. For example, FIGS. 3A to 3E are enlarged sectional views, each of which is taken along line II-III of FIG. 2 and illustrates a region I of FIG. 1. For concise description, a previously described element may be identified by a similar or identical reference number without repeating an overlapping description thereof.

Figure 3A:
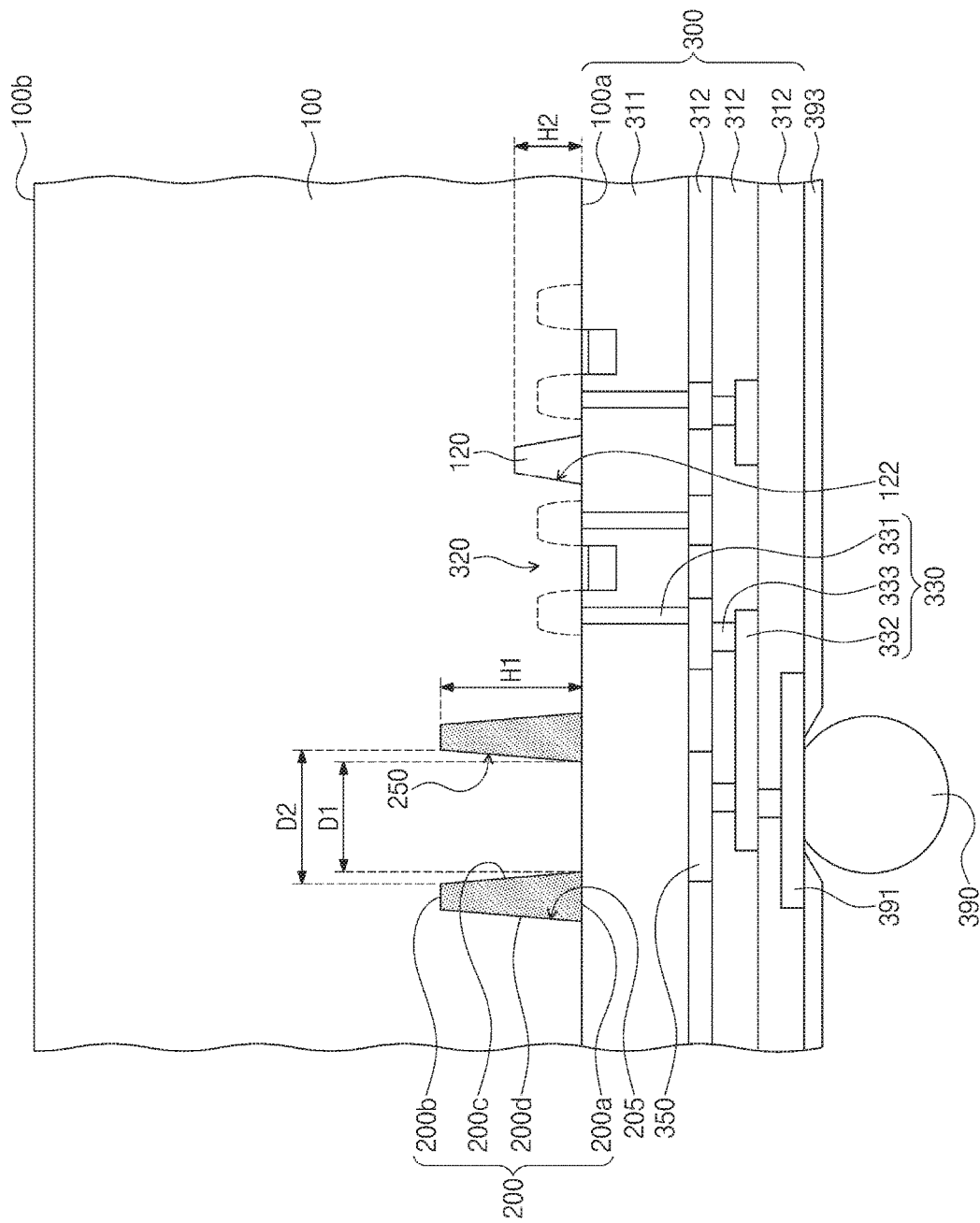

Referring to FIGS. 2 and 3A, the semiconductor substrate 100 may be provided. A device isolation pattern 120 may be formed in the semiconductor substrate 100 and may define active regions of transistors 320. The device isolation pattern 120 may be formed of or include an insulating material. The formation of the device isolation pattern 120 may include forming a trench 122 in the first surface 100a of the semiconductor substrate 100 and filling the trench 122 with an insulating material.

An etch stop pattern 200 may be formed in the semiconductor substrate 100. The formation of the etch stop pattern 200 may include forming a first trench 205 in the semiconductor substrate 100 and filling the first trench 205 with an insulating material. In some example embodiments, the etch stop pattern 200 may be formed of or include a silicon-containing insulating material (e.g., silicon oxide, silicon nitride, or silicon oxynitride). In some example embodiments, the etch stop pattern 200 may be formed of or include a low-k dielectric material (e.g., hafnium oxide or zirconium oxide), but the inventive concepts may not be limited thereto. The etch stop pattern 200 may have a top surface 200b, a bottom surface 200a, an inner side surface 200c, and an outer side surface 200d. The bottom surface 200a of the etch stop pattern 200 may be substantially coplanar with the first surface 100a of the semiconductor substrate 100. The top and bottom surfaces 200a and 200b of the etch stop pattern 200 may be surfaces facing each other. The inner and outer side surfaces 200c and 200d of the etch stop pattern 200 may be inclined at an angle to the first surface 100a of the semiconductor substrate 100.

When viewed in a plan view, the etch stop pattern 200 may have a closed-loop shape, as shown in FIG. 2. However, a planar shape of the etch stop pattern 200 is not limited to the illustrated shape. The etch stop pattern 200 may have a hole 250 that is formed to penetrate therethrough. A diameter D1 of the hole 250 at the level of the bottom surface 200a may be smaller than a diameter D2 of the hole 250 at the level of the top surface 200b. A diameter of the hole 250 may decrease in a direction toward the first surface 100a of the semiconductor substrate 100. The hole 250 may be formed to expose the inner side surface 200c of the etch stop pattern 200. The outer side surface 200d of the etch stop pattern 200 may not be exposed by the hole 250 and may be covered with the semiconductor substrate 100. A height H1 of the etch stop pattern 200 may be greater than a height H2 of the device isolation pattern 120. The etch stop pattern 200 and the device isolation pattern 120 may be formed at the same time by the same process or different times by different processes.

The circuit layer 300 may be formed on the first surface 100a of the semiconductor substrate 100. The circuit layer 300 may include the transistors 320, an interconnection structure 330, and a via pad 350, in addition to the first insulating layer 311 and the second insulating layer 312. For example, the transistors 320 may be formed on the first surface 100a of the semiconductor substrate 100. The first insulating layer 311 may be formed on the first surface 100a of the semiconductor substrate 100 to cover the transistors 320. The first insulating layer 311 may be formed of or include silicon oxide, silicon nitride, or silicon oxynitride. In some example embodiments, as illustrated in FIG. 3A, a plurality of second insulating layers 312 may be provided in the circuit layer 300. The second insulating layers 312 may be stacked on the first insulating layer 311. The interconnection structure 330 may include a contact plug 331, a metal pattern 332, and a metal via 333. The interconnection structure 330 may be formed of or include a conductive material (e.g., copper or tungsten). The contact plug 331 may be coupled to the transistors 320 through the first insulating layer 311. The metal pattern 332 may be provided between the insulating layers 311 and 312. The metal via 333 may be formed to penetrate at least one of the second insulating layers 312 and may be coupled to the metal pattern 332. The via pad 350 may be provided in the insulating layer. The via pad 350 may be formed of or include a conductive material (e.g., copper, aluminum, or tungsten). The connection terminal 390 may be formed on the bottom surface of the circuit layer 300. A solder pad 391 may be provided between the circuit layer 300 and the connection terminal 390 and may be coupled to the connection terminal 390. The transistors 320 may be electrically connected to the connection terminal 390 through the interconnection structure 330. The via pad 350 may be electrically connected to the connection terminal 390 through the interconnection structure 330. A first protection layer 393 may be provided on the bottom surface of the circuit layer 300. The first protection layer 393 may not cover the connection terminal 390. The first protection layer 393 may be formed of or include an insulating material (e.g., polymer).

Figure 3B:
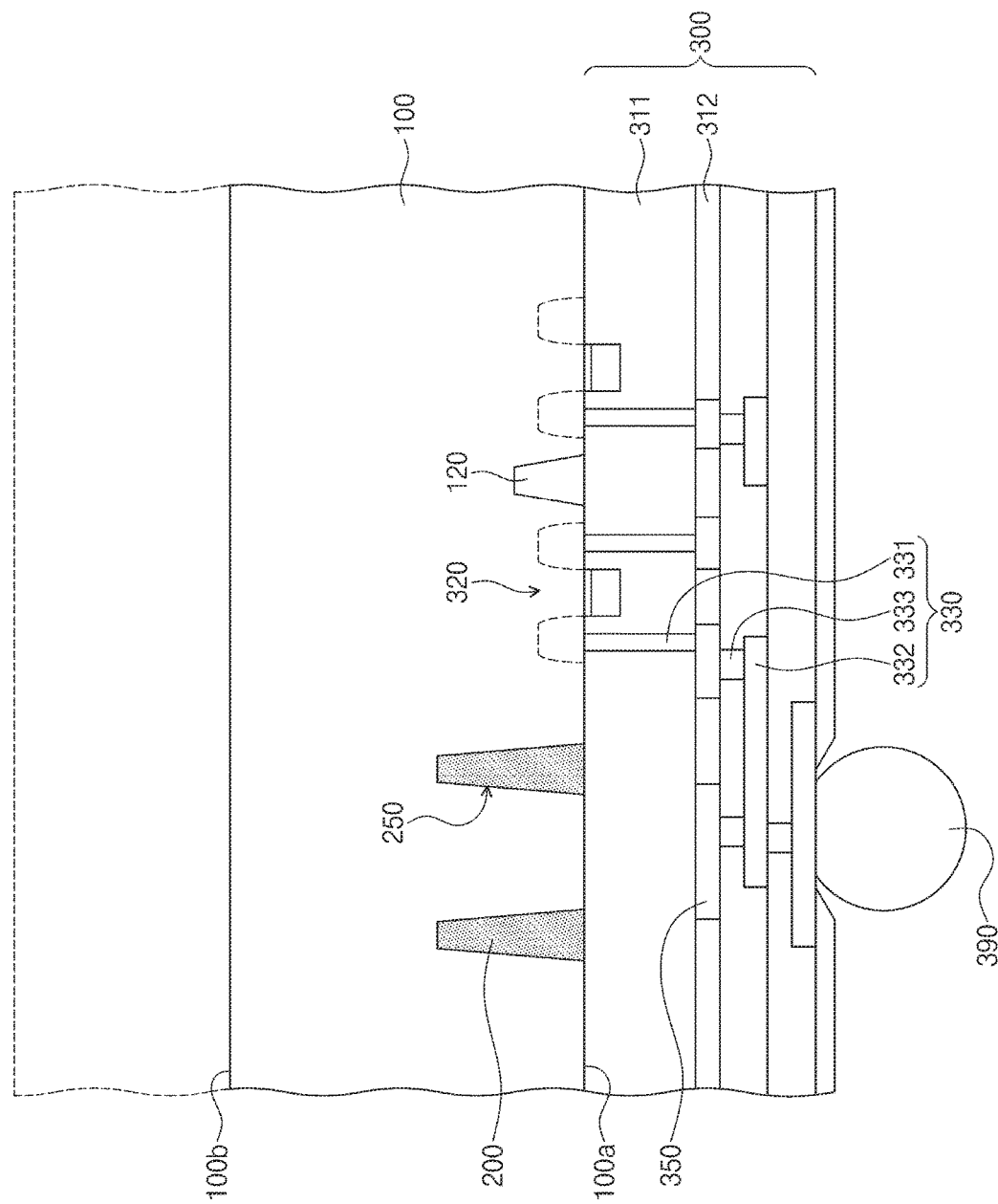

Referring to FIG. 3B, a polishing or grinding process may be performed on the second surface 100b of the semiconductor substrate 100 to remove a portion of the semiconductor substrate 100. The polishing process may be a chemical mechanical polishing (CMP) process. As a result of the polishing or grinding process, the semiconductor substrate 100 may have a reduced thickness.

Figure 3C:
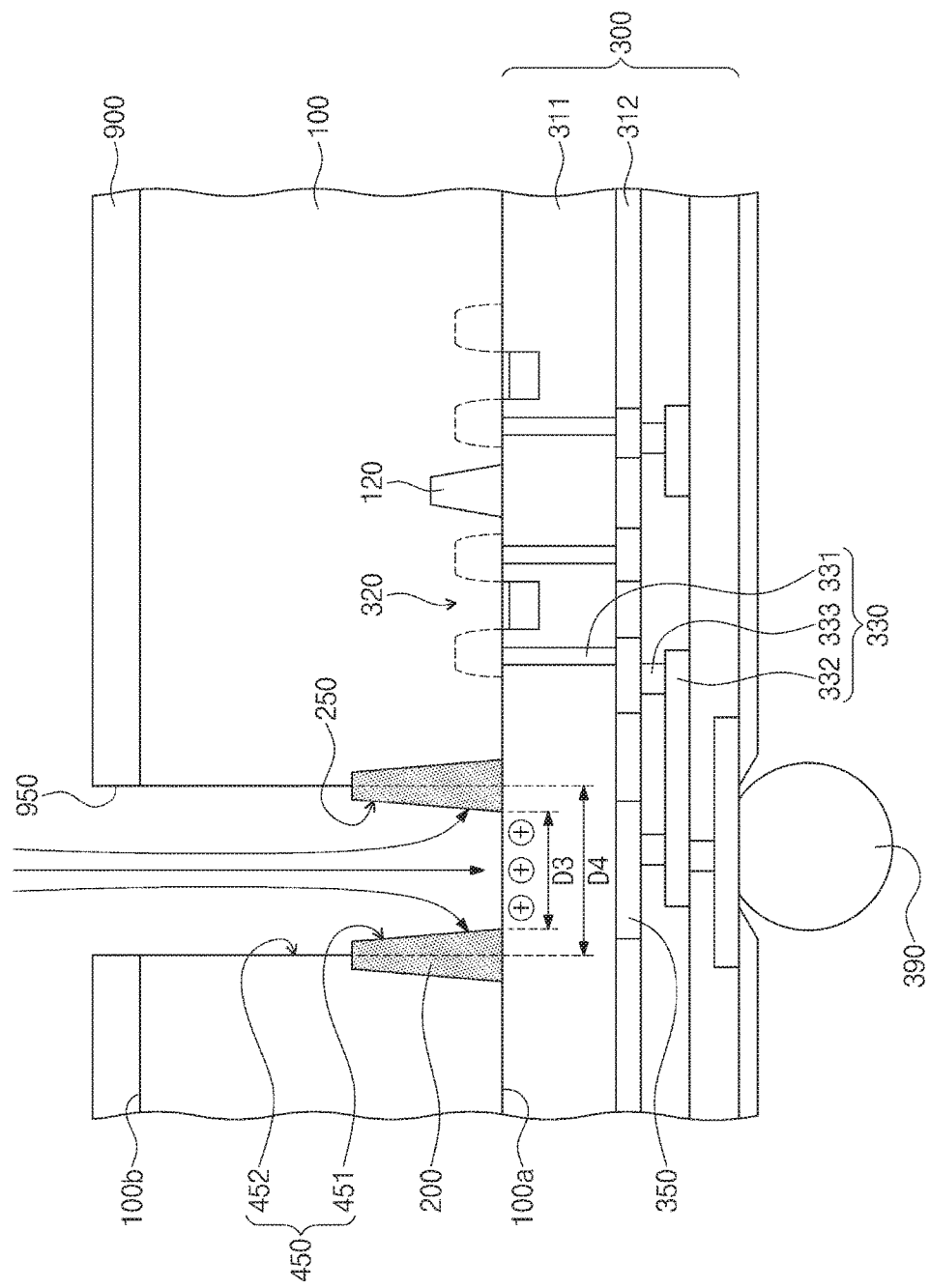

Referring to FIGS. 2 and 3C, a through hole 450 may be formed in the semiconductor substrate 100. In some example embodiments, a mask pattern 900 may be formed on the second surface 100b of the semiconductor substrate 100. The mask pattern 900 may have an opening 950 exposing the semiconductor substrate 100. The semiconductor substrate 100 may be etched using the mask pattern 900 as an etch mask. For example, a dry etching process, in which fluorine-containing gas is used, may be performed to etch the semiconductor substrate 100.

An etching gas may be prepared to produce reactive ions in a chamber. The reactive ions may be positive charges. The reactive ions may collide and react with the semiconductor substrate 100, during the etching process, and thus, the semiconductor substrate 100 may be etched. In the process of etching the semiconductor substrate 100, interfacial defects may be formed on a side surface of the through hole 450. For example, the interfacial defects may be formed in the semiconductor substrate 100 exposed by the through hole 450. The process of etching the semiconductor substrate 100 may be performed until the first insulating layer 311 is exposed through the through hole 450. During the etching process, the first insulating layer 311 may have an etch selectivity with respect to the semiconductor substrate 100.

Figure 4B:
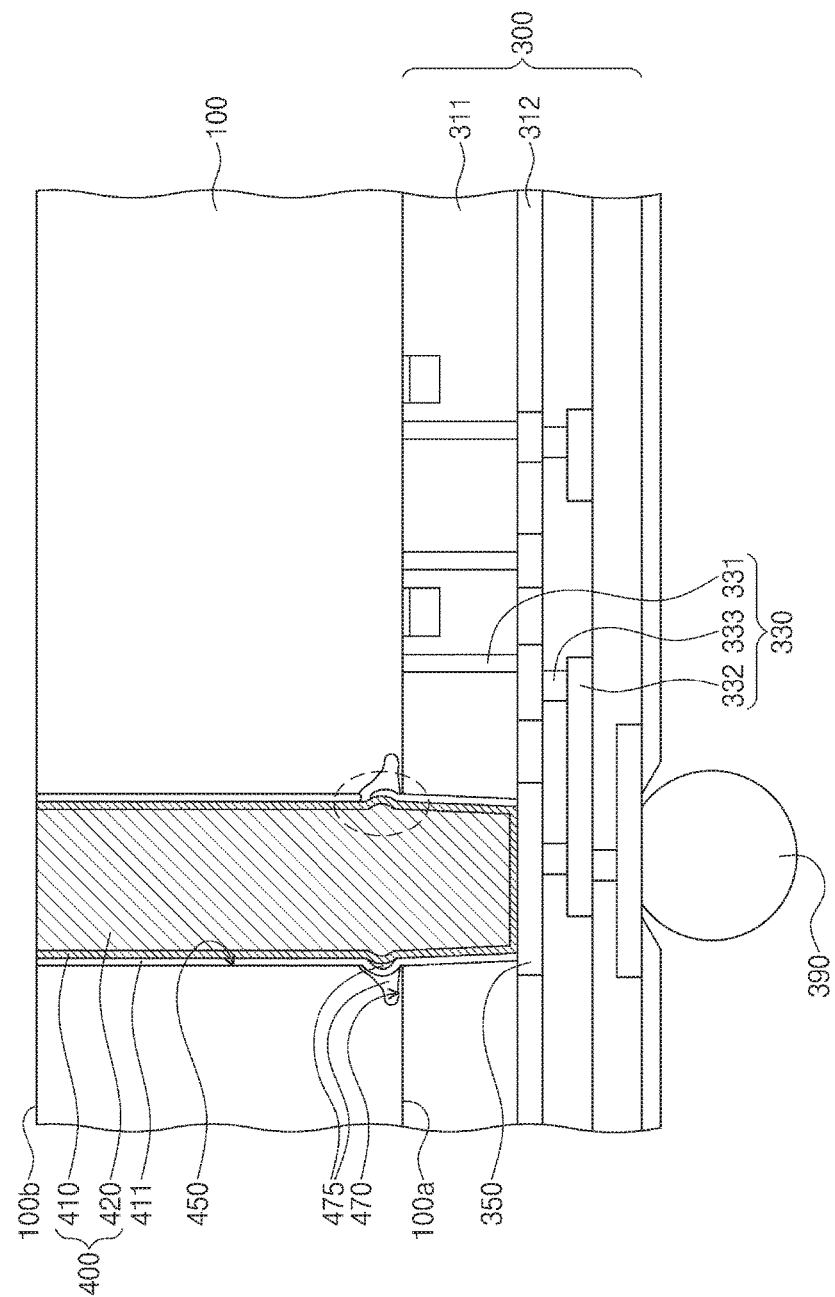

FIGS. 4A and 4B are sectional views illustrating a method of fabricating a semiconductor device, according to some example embodiments of the inventive concepts. For concise description, a previously described element may be identified by a similar or identical reference number without repeating an overlapping description thereof Referring to FIG. 4A, the circuit layer 300 may be formed on the first surface 100a of the semiconductor substrate 100. Unlike that of FIG. 3A, the etch stop pattern 200 may not be formed. The through hole 450 may be formed by etching the semiconductor substrate 100. The etching process on the semiconductor substrate 100 may be performed using substantially the same method as that described with reference to FIG. 3C. The through hole 450 may be formed to expose the first insulating layer 311. The etching process may be continued for a while after the first insulating layer 311 is exposed. In this case, a top surface of the first insulating layer 311 exposed by the through hole 450 may be positively charged by the reactive ions. If the etching process is continued excessively, some of the reactive ions may be deflected by the positive charges in the first insulating layer 311 and may be tilted toward a lower side surface of the through hole 450, as shown by the arrows. As a result, the lower side surface of the through hole 450 may be etched to form a recess region 470. The recess region 470 may be connected to the through hole 450. For example, the recess region 470 may have a shape extending from the through hole 450 into the semiconductor substrate 100. The recess region 470 may be formed to be adjacent to the first surface 100a of the semiconductor substrate 100.

Referring to FIG. 4B, the first insulating layer 311 may be etched, and thus, the through hole 450 may be further extended into the first insulating layer 311. The through hole 450 may be formed to expose the via pad 350. A liner layer 411 and the through via 400 may be formed in the through hole 450. The liner layer 411 may be formed on the side surface of the through hole 450. The through via 400 may be formed on the liner layer 411. The through via 400 may include a barrier pattern 410 and a conductive pattern 420. The liner layer 411 may not be extended into the recess region 470. Thus, a void 475 may be formed in the recess region 470. As an example, the void 475 may be formed between the liner layer 411 and the semiconductor substrate 100. As another example, even when the liner layer 411 is extended into the recess region 470, the through via 400 may not be provided in the recess region 470. In this case, the void 475 may be formed between the liner layer 411 and the through via 400. As other example, the liner layer 411 may be formed to have an excessively small thickness in the recess region 470 or to expose at least a portion of the through via 400, in a region depicted by a dotted line.

Referring back to FIGS. 2 and 3C, the etch stop pattern 200 may be formed in the semiconductor substrate 100. The through hole 450 may be formed to penetrate the semiconductor substrate 100 and may extend into the hole 250 of the etch stop pattern 200. The semiconductor substrate 100 may be exposed through a side surface of an upper region 452 of the through hole 450. A lower region 451 of the through hole 450 may be farther from the second surface 100b of the semiconductor substrate 100 than the upper region 452 of the through hole 450. The lower region 451 of the through hole 450 may be connected to the upper region 452. The lower region 451 of the through hole 450 may be formed to expose the etch stop pattern 200. The lower region 451 of the through hole 450 may include, or be the same as, the hole 250 of the etch stop pattern 200. The etch stop pattern 200 may surround a lateral surface of the lower region 451 of the through hole 450. Accordingly, even though the process for etching the semiconductor substrate 100 is further performed after the exposing of the first insulating layer 311, the etch stop pattern 200 may reduce or prevent reactive ions from propagating toward the semiconductor substrate 100. Since the etch stop pattern 200 is etch-resistant to the reactive ions, reducing or preventing the recess region (e.g., 470 of FIG. 4A) from being formed in the lower region 451 of the through hole 450 may be possible. In some example embodiments, the semiconductor device may include a plurality of the through holes 450, as shown in FIG. 1. In some example embodiments, since the formation of the recess region 470 is reduced or prevented, improving the uniformity in size and shape of the through holes 450 may be possible. Thus, for the sake of brevity, only one of the through holes 450 will be described below.

A diameter D3 of the through hole 450 at or near the level of the first surface 100a may be smaller than a diameter D4 of the through hole 450 at or near the level of the second surface 100b. The upper region 452 of the through hole 450 may be formed to have a side surface that extends in a direction normal to the second surface 100b of the semiconductor substrate 100. By contrast, the side surface of the lower region 451 may have an angle different from that of the side surface of the upper region 452. In some example embodiments, the presence of the etch stop pattern 200 may lead to a reduction in the diameter of the through hole 450 at the level of the first surface 100a. Similar to that of the hole 250, the diameter D3 of the lower region 451 of the through hole 450 may decrease in a direction toward the first surface 100a of the semiconductor substrate 100. Although not shown, the diameter of the upper region 452 of the through hole 450 may decrease in a direction away from the first surface 100a of the semiconductor substrate 100.

Figure 3D:
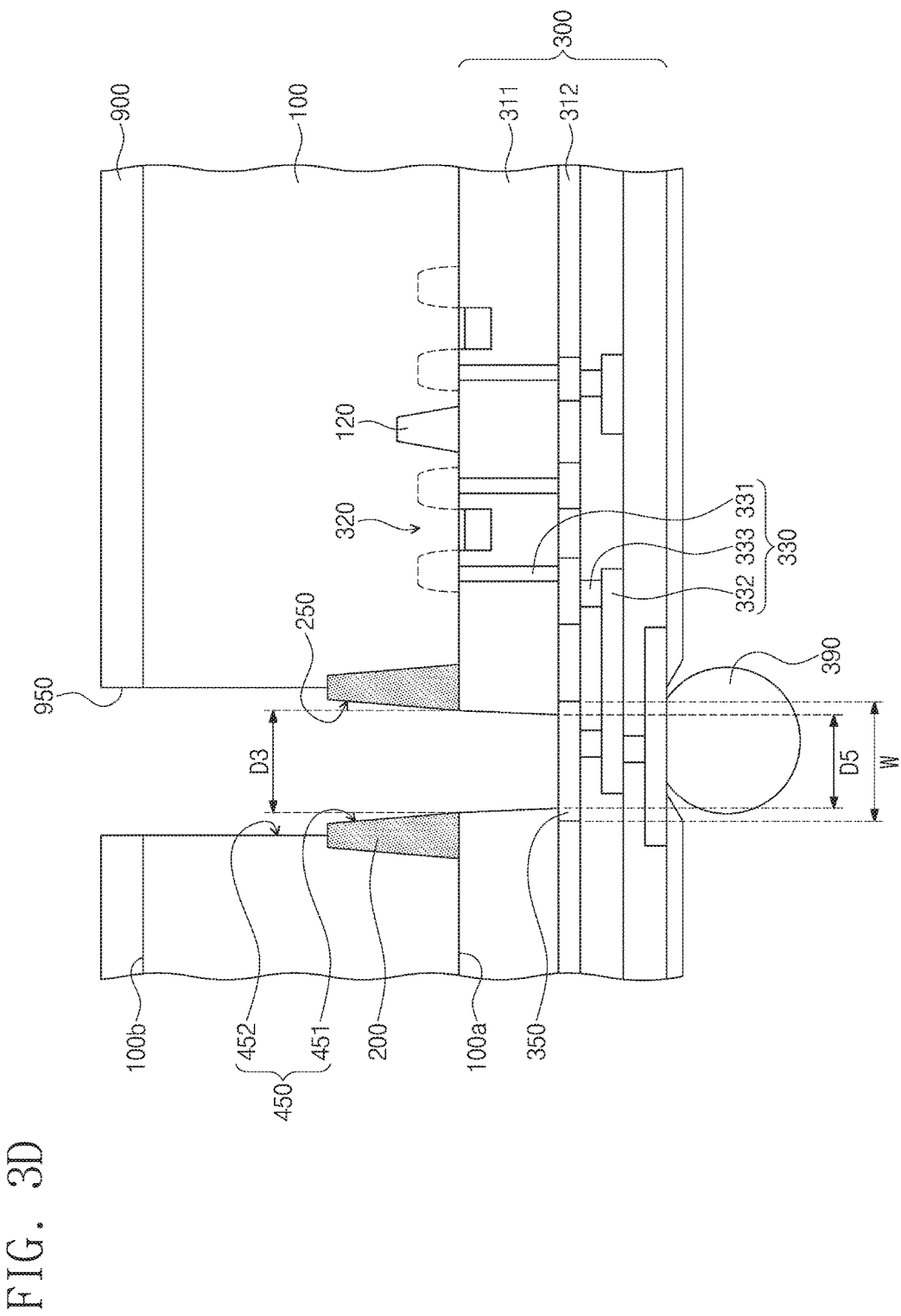

Referring to FIG. 3D, the first insulating layer 311 may be etched to expand the through hole 450 into the first insulating layer 311. For example, a bottom surface of the through hole 450 may expose the via pad 350. The etching of the first insulating layer 311 may be performed by a dry etching process using a fluorine-containing gas. In some example embodiments, the etching of the first insulating layer 311 may be performed in an anisotropic manner. A diameter D5 of the bottom surface of the through hole 450 may be equal to or smaller than the diameter D3 of the through hole 450 at or near the level of the first surface 100a. For example, the diameter of the through hole 450 in the first insulating layer 311 may decrease in a direction toward the bottom surface of the through hole 450. The side surface of the through hole 450 in the first insulating layer 311 may have an angle different from that of the side surface of the lower region 451 of the through hole 450.

Although not shown, the side surface of the through hole 450 in the first insulating layer 311 may be substantially perpendicular to the first surface 100a of the semiconductor substrate 100. In some example embodiments, an absolute value of an angle of the side surface of the through hole 450 may be greater in the first insulating layer 311 than in the etch stop pattern 200, when measured with respect to the first surface 100a of the semiconductor substrate 100. A width W of the via pad 350 may be greater than the diameter D5 of the bottom surface of the through hole 450 corresponding thereto. Accordingly, even if there is a process error in the process of forming the through via 400, the through hole 450 may be formed to effectively expose the via pad 350. In some example embodiments, the presence of the etch stop pattern 200 may lead to an additional reduction in the bottom diameter D5 of the through hole 450. This may make it possible to further reduce a width of the via pad 350 and consequently to increase a degree of freedom in disposing the interconnection structure 330.

In some example embodiments, even if there is a process error in the process of forming the opening 950, the through hole 450 can be normally formed. For example, even if a width of the opening 950 of the mask pattern 900 is greater than the width W of the via pad 350 or the opening 950 and formed at a position misaligned from the via pad 350, the through hole 450 may be formed to expose the via pad 350, owing to the presence of the etch stop pattern 200. Thereafter, the mask pattern 900 may be removed.

Referring to FIG. 3E, the liner layer 411 and the through via 400 may be formed in the through hole 450. The liner layer 411 may be formed to cover the side surface of the through hole 450 but to expose the via pad 350. The liner layer 411 may be formed of or include at least one of silicon oxide, silicon nitride, silicon oxynitride, or low-k dielectric materials. The liner layer 411 may be conformally formed on the side surface of the through hole 450. The through via 400 may be formed on the liner layer 411.

The through via 400 may include a barrier pattern 410 and a conductive pattern 420. The barrier pattern 410 may be formed on the liner layer 411. The barrier pattern 410 may be formed of or include at least one of titanium (Ti), titanium nitride (TiN), tantalum (Ta), tantalum nitride (TaN), or any combination thereof. The conductive pattern 420 may be formed on the barrier pattern 410 to fill the through hole 450. For example, the formation of the barrier pattern 410 may include forming a seed layer (not shown) on the liner layer 411 and then performing an electroplating process using the seed layer. As a result of the electroplating process, the through hole 450 may be filled with a conductive material. The conductive material may be planarized to form the conductive pattern 420. The conductive pattern 420 may include copper or tungsten.

A top surface 400b of the through via 400 may be substantially coplanar with the second surface 100b of the semiconductor substrate 100, and a bottom surface 400a of the through via 400 may be coupled to the via pad 350. The through via 400 may have a shape corresponding to that of the through hole 450. For example, a diameter of the bottom surface 400a of the through via 400 may be smaller than a diameter of the top surface 400b of the through via 400. Since the recess region 470 is not formed, it may be possible to reduce or prevent a void 475 of FIG. 4B from being formed between the semiconductor substrate 100 and the through via 400. Accordingly, a semiconductor device may have an improved reliability. As described above, interfacial defects may be formed on the side surface of the through hole 450, during the etching of the semiconductor substrate 100. The liner layer 411 may be formed to conformally cover the side surface of the through via 400. The liner layer 411 may reduce or prevent the through via 400 from being damaged (e.g., oxidized) by the interfacial defects.

A second protection layer 193 and a connection pad 190 may be formed on the second surface 100b of the semiconductor substrate 100. The second protection layer 193 may be formed of or include an insulating material (e.g., polymer). The connection pad 190 may be formed on the through via 400 and may be electrically connected to the through via 400. The connection pad 190 may be formed of or include a metallic material. Unlike that illustrated in FIG. 3A, the connection terminal 390 may be formed on the bottom surface of the circuit layer 300, after the formation of the through via 400. A semiconductor device according to some example embodiments of the inventive concepts may be fabricated by the afore-described processes.

Figure 5A:
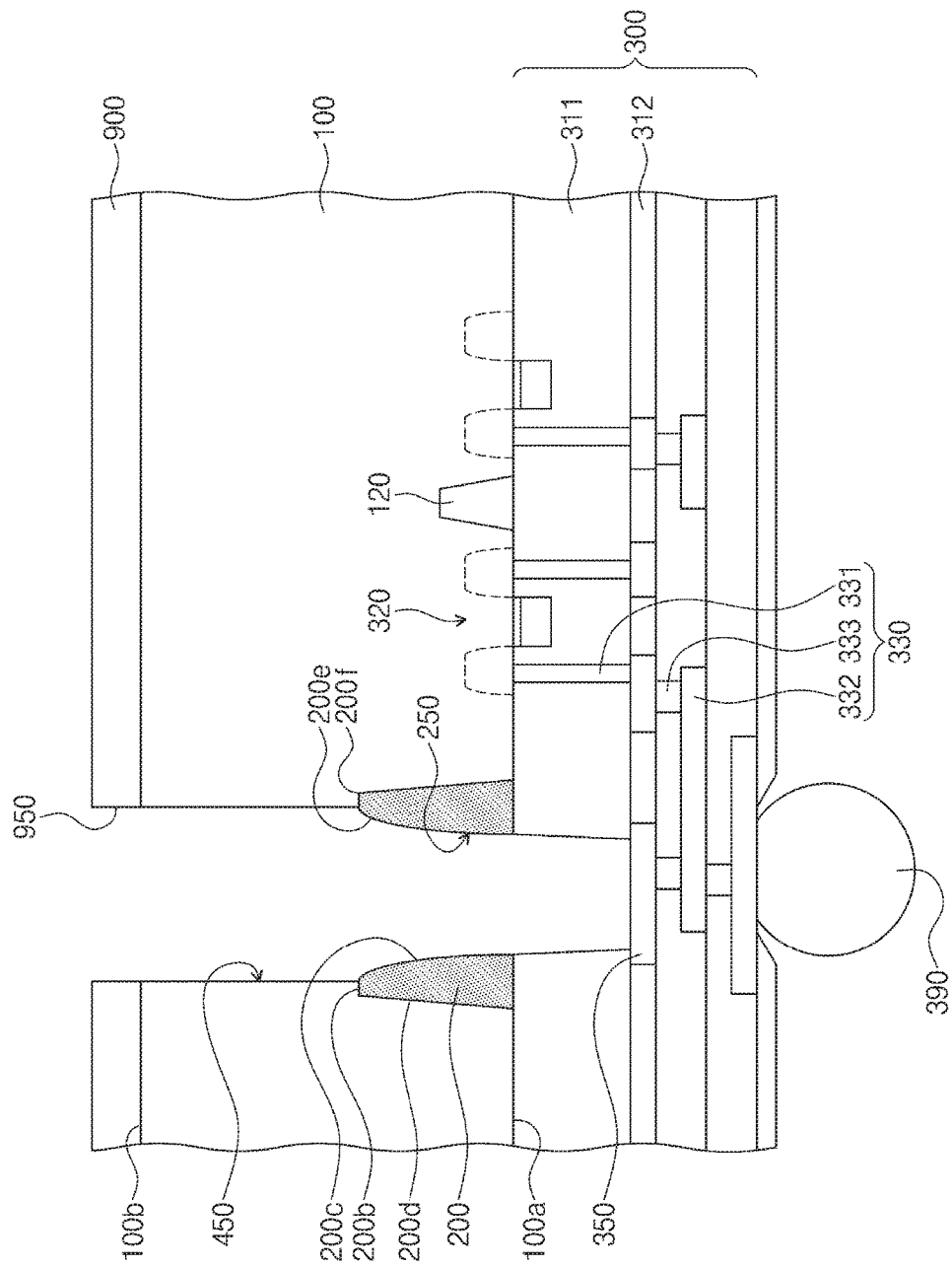
FIGS. 5A and 5B are sectional views illustrating a method of fabricating a semiconductor device, according to some example embodiments of the inventive concepts.
Figure 5B:
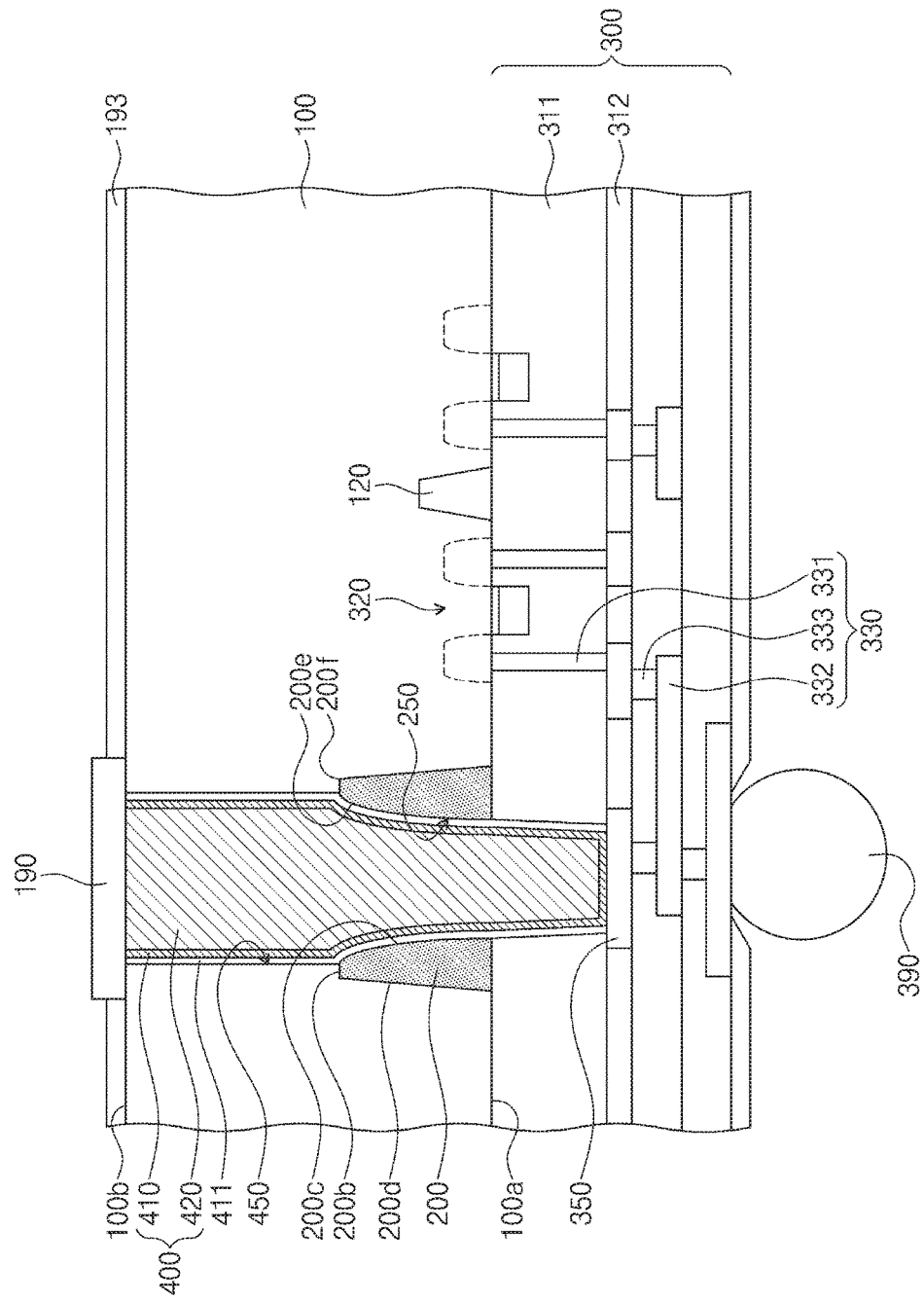

FIGS. 5A and 5B are sectional views illustrating a method of fabricating a semiconductor device, according to some example embodiments of the inventive concepts. For concise description, a previously described element may be identified by a similar or identical reference number without repeating an overlapping description thereof.

Referring to FIG. 5A in conjunction with FIG. 1, the through hole 450 may be formed in the semiconductor substrate 100. The formation of the through hole 450 may be performed using substantially the same method as that described with reference to FIGS. 3A to 3C. For example, the semiconductor substrate 100 with the etch stop pattern 200 may be provided. The hole 250 may be defined by the etch stop pattern 200. The circuit layer 300 may be formed on the first surface 100a of the semiconductor substrate 100. A polishing or grinding process may be performed on the second surface 100b of the semiconductor substrate 100.

The semiconductor substrate 100 exposed by the mask pattern 900 may be etched to form the through hole 450 in the semiconductor substrate 100.

The first insulating layer 311 may be etched to expand the through hole 450 into the first insulating layer 311. The inner side and top surfaces 200c and 200b of the etch stop pattern 200 may also be etched during the etching of the first insulating layer 311. The outer side surface 200d of the etch stop pattern 200 may not be exposed during the etching of the first insulating layer 311. Accordingly, a first edge 200e of the etch stop pattern 200 may have a more rounded profile, compared to that of a second edge 200f. Here, the first edge 200e may be a portion of the etch stop pattern 200 that is defined by the top and inner side surfaces 200b and 200c, and the second edge 200f may be another portion of the etch stop pattern 200 that is defined by the top and outer side surfaces 200b and 200d. The inner side surface 200c of the etch stop pattern 200 may have a more rounded profile, compared to that of the outer side surface 200d of the etch stop pattern 200.

Referring to FIG. 5B, the liner layer 411 and the through via 400 may be formed in the through hole 450. The liner layer 411 and the through via 400 may be formed by the same method as that described with reference to FIG. 3E. For example, the conductive pattern 420 may be formed to fill the through hole 450, and the barrier pattern 410 may be formed on side and bottom surfaces of the conductive pattern 420.

Figure 5C:
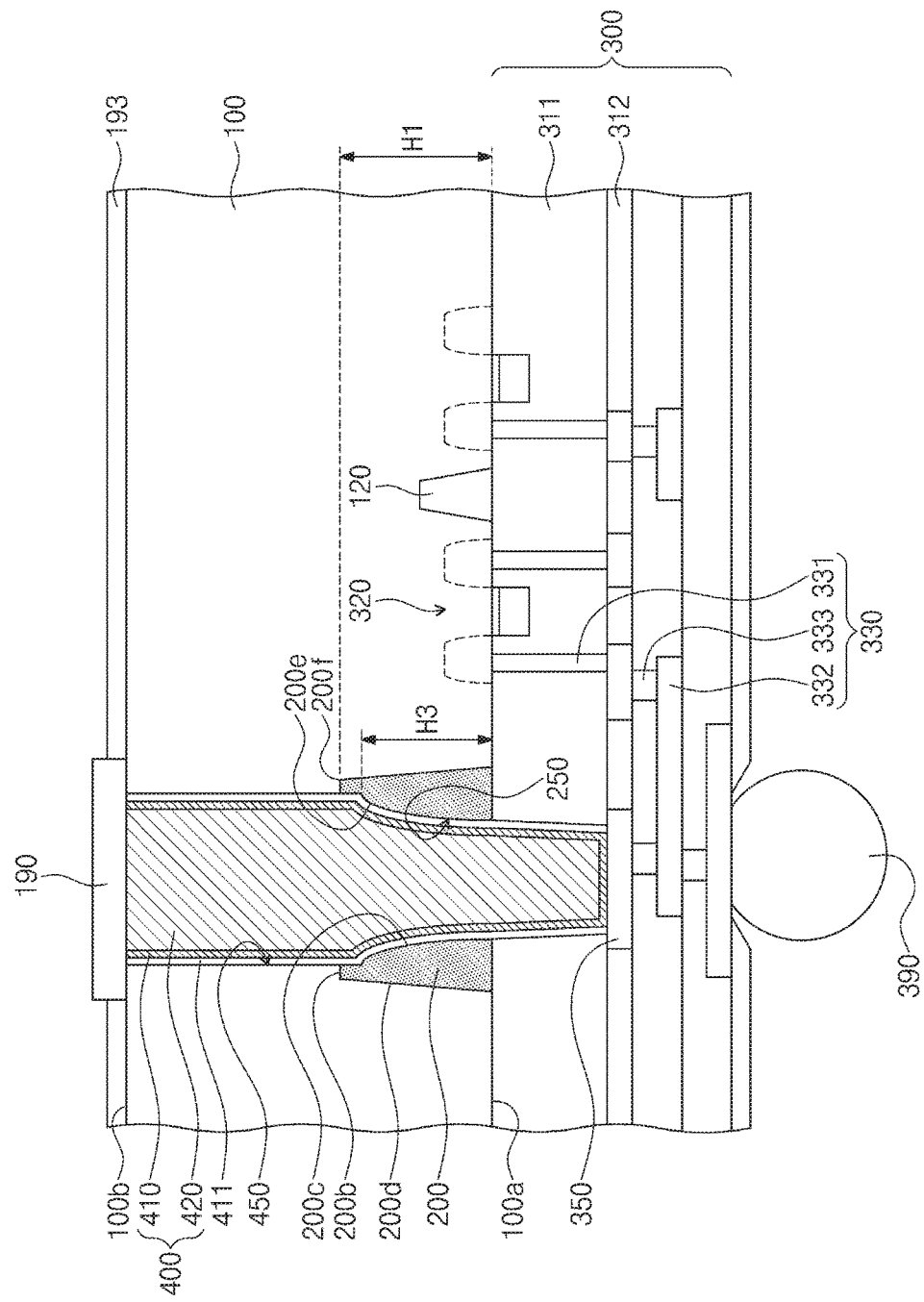
FIG. 5C is a sectional view illustrating a semiconductor device according to some example embodiments of the inventive concepts.

FIG. 5C is a sectional view illustrating a semiconductor device according to some example embodiments of the inventive concepts. For concise description, a previously described element may be identified by a similar or identical reference number without repeating an overlapping description thereof.

Referring to FIG. 5C, the semiconductor device may include the semiconductor substrate 100, the circuit layer 300, the etch stop pattern 200, the liner layer 411, and the through via 400. The formation of the through hole 450 may include etching the semiconductor substrate 100 and etching the first insulating layer 311. When the first insulating layer 311 is etched, the inner side and top surfaces 200c and 200b of the etch stop pattern 200 may be etched along with the first insulating layer 311. The first edge 200e of the etch stop pattern 200 may have a more rounded profile, compared to that of the second edge 200f. The inner side surface 200c of the through via 400 may have a more rounded profile, compared to that of the outer side surface 200d. A height H3 of the etch stop pattern 200 exposed by the through hole 450 may be smaller than the height H1 of the etch stop pattern 200 covered with the semiconductor substrate 100. In the present specification, a height of an element may mean the maximum height thereof.

FIGS. 6A to 6D are sectional views illustrating a method of fabricating a semiconductor device, according to some example embodiments of the inventive concepts. For concise description, a previously described element may be identified by a similar or identical reference number without repeating an overlapping description thereof.

Figure 6A:
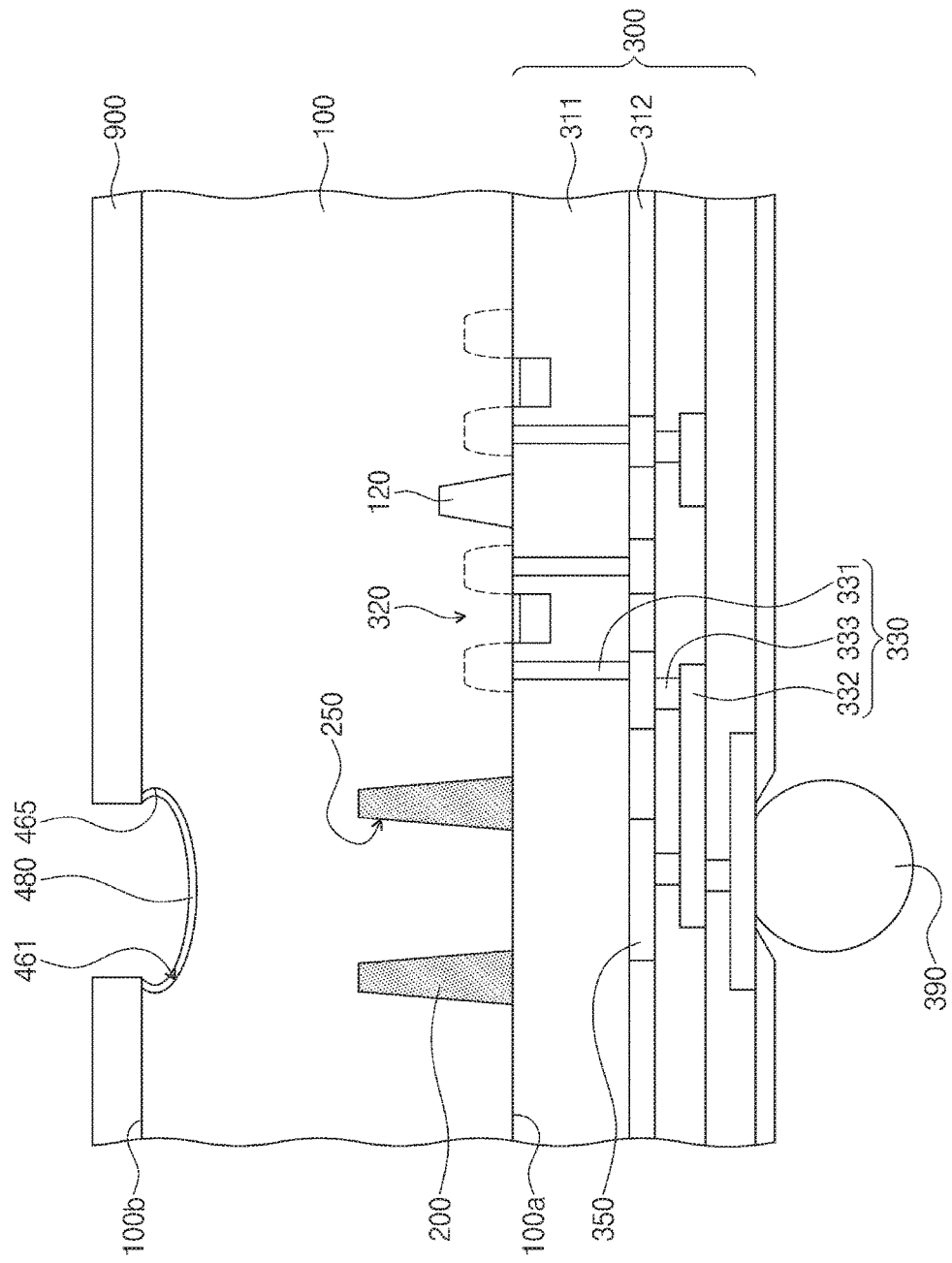

Referring to FIG. 6A in conjunction with FIG. 1, the semiconductor substrate 100 with the etch stop pattern 200 may be provided. The circuit layer 300 may be formed on the first surface 100a of the semiconductor substrate 100. The semiconductor substrate 100 exposed by the mask pattern 900 may be etched to form a first sub-hole 461 in the semiconductor substrate 100. The first sub-hole 461 may be formed by a dry etching process using a fluorine-containing gas. As an example, the first sub-hole 461 may be formed by isotropically etching the semiconductor substrate 100. A side surface of the first sub-hole 461 may have a concave region 465. The concave region 465 may be a region laterally extending from the first sub-hole 461 toward the semiconductor substrate 100. An organic material may be deposited to form a protection pattern 480 covering the first sub-hole 461. The formation of the protection pattern 480 may be performed using a carbon-containing gas (e.g., $C_4F_8$), but the inventive concepts may not be limited thereto.

Figure 6B:
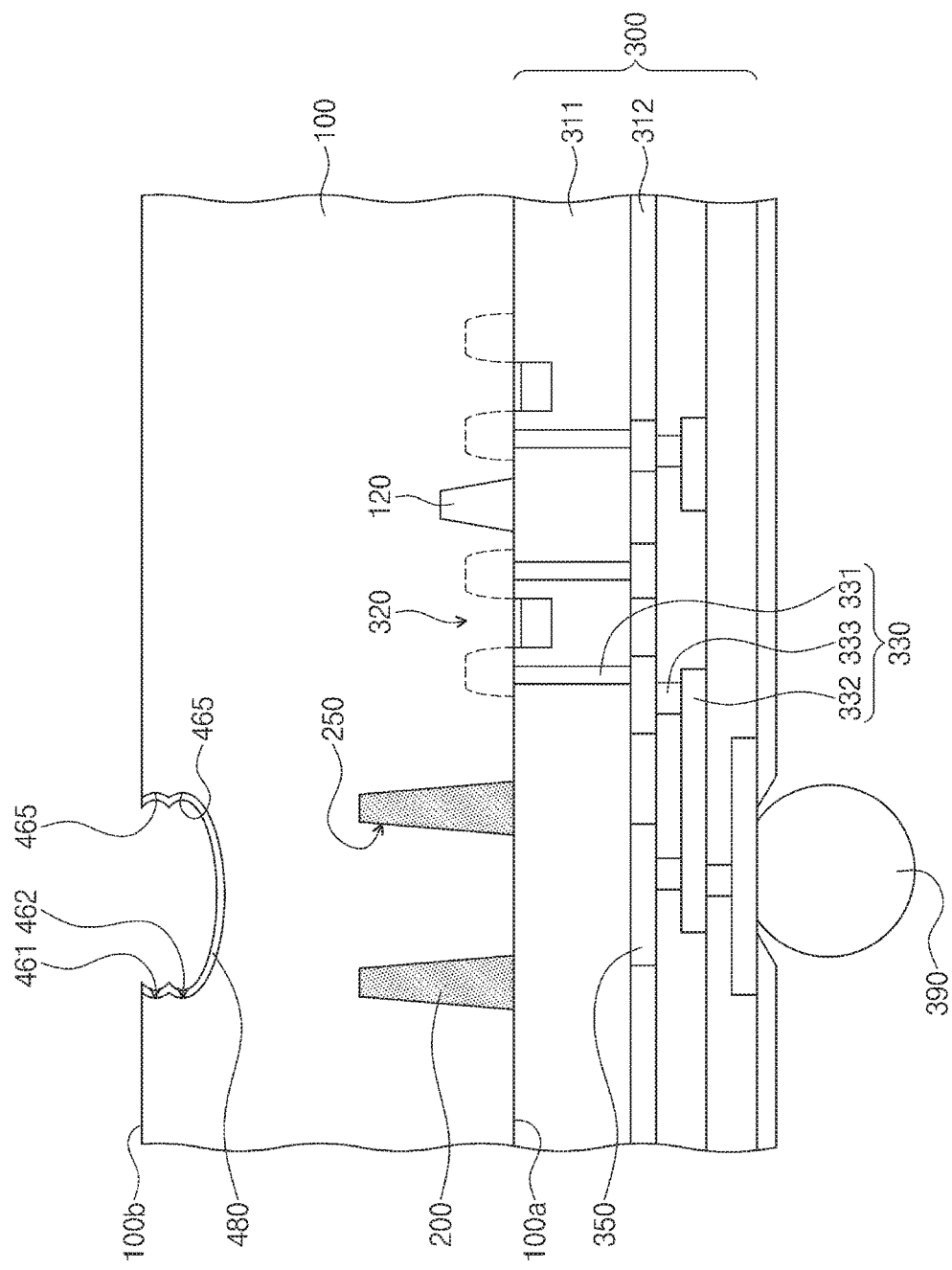

Referring to FIG. 6B, the semiconductor substrate 100 may be further etched to form a second sub-hole 462 in the first sub-hole 461. In the process of etching the semiconductor substrate 100, the protection pattern 480 may be removed from a bottom surface of the first sub-hole 461 but not from a side surface of the first sub-hole 461. The protection pattern 480 may protect a side surface of the first sub-hole 461 during the etching process for forming the second sub-hole 462. The second sub-hole 462 may have the concave region 465 that is defined by an internal side surface of the semiconductor substrate 100. An organic material may be deposited to form the protection pattern 480 covering the second sub-hole 462. The etching of the semiconductor substrate 100 and the formation of the protection pattern 480 may be performed using substantially the same methods as those of FIG. 6A.

Figure 6C:
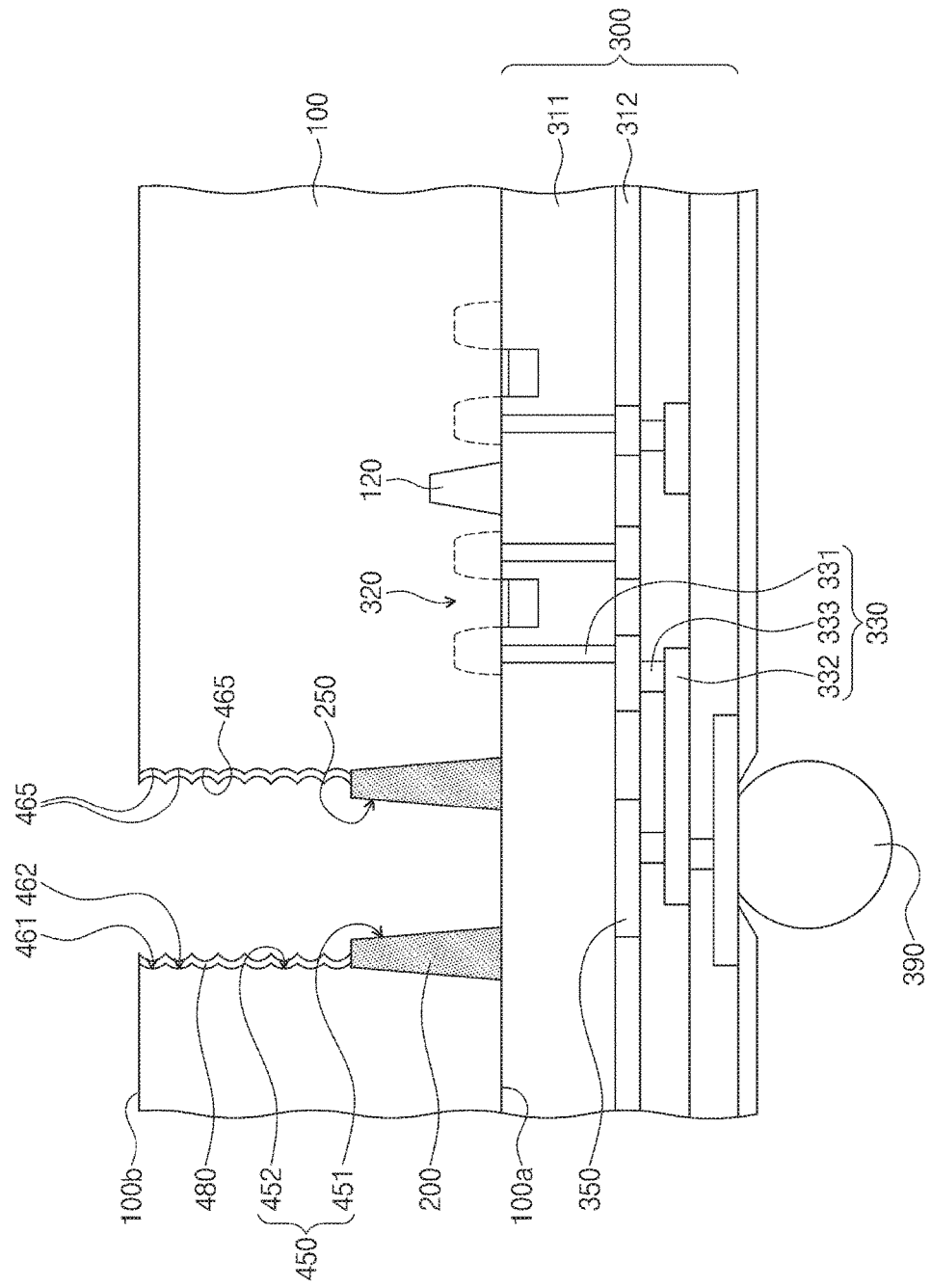

Referring to FIG. 6C, the etching of the semiconductor substrate 100 and the deposition of the protection pattern 480 may be alternatingly repeated to form the through hole 450 in the semiconductor substrate 100. The etching of the semiconductor substrate 100 and the formation of the protection pattern 480 may be formed using substantially the same methods as those described with reference to FIG. 6A. The through hole 450 may include a plurality of sub-holes 461 and 462. The protection pattern 480 may protect side surfaces of the sub-holes 461 and 462 during the process of etching the semiconductor substrate 100. Accordingly, the upper region 452 of the through hole 450 may have a side surface extending in a direction that is substantially normal to the second surface 100b of the semiconductor substrate 100. The upper region 452 of the through hole 450 may have a sidewall that is shaped like a scallop. For example, a plurality of the concave regions 465 may be formed on the side surface of the upper region 452 of the through hole 450. The concave regions 465 may be arranged in a direction normal to the second surface 100b of the semiconductor substrate 100 and may be connected to each other. The concave regions 465 may be formed between the through hole 450 and the semiconductor substrate 100 to define a curved interface therebetween. Thereafter, the protection pattern 480 may be removed. Since the etch stop pattern 200 is not etched during the process of forming the through hole 450, the lower region 451 of the through hole 450 may not have the concave region 465.

Referring to FIG. 6D, the first insulating layer 311 may be etched to expand the through hole 450 into the first insulating layer 311. The through hole 450 may be formed to expose the via pad 350. The liner layer 411 and the through via 400 may be formed in the through hole 450. The liner layer 411 and the through via 400 may have shapes corresponding to that of the side surface of the through hole 450. For example, an upper side surface of the through via 400 may have a plurality of convex portions 405. Each of the convex portions 405 may be a portion laterally protruding toward the semiconductor substrate 100 from the through via 400. A lower side surface of the through via 400 may be flatter than the upper side surface.

Figure 7A:
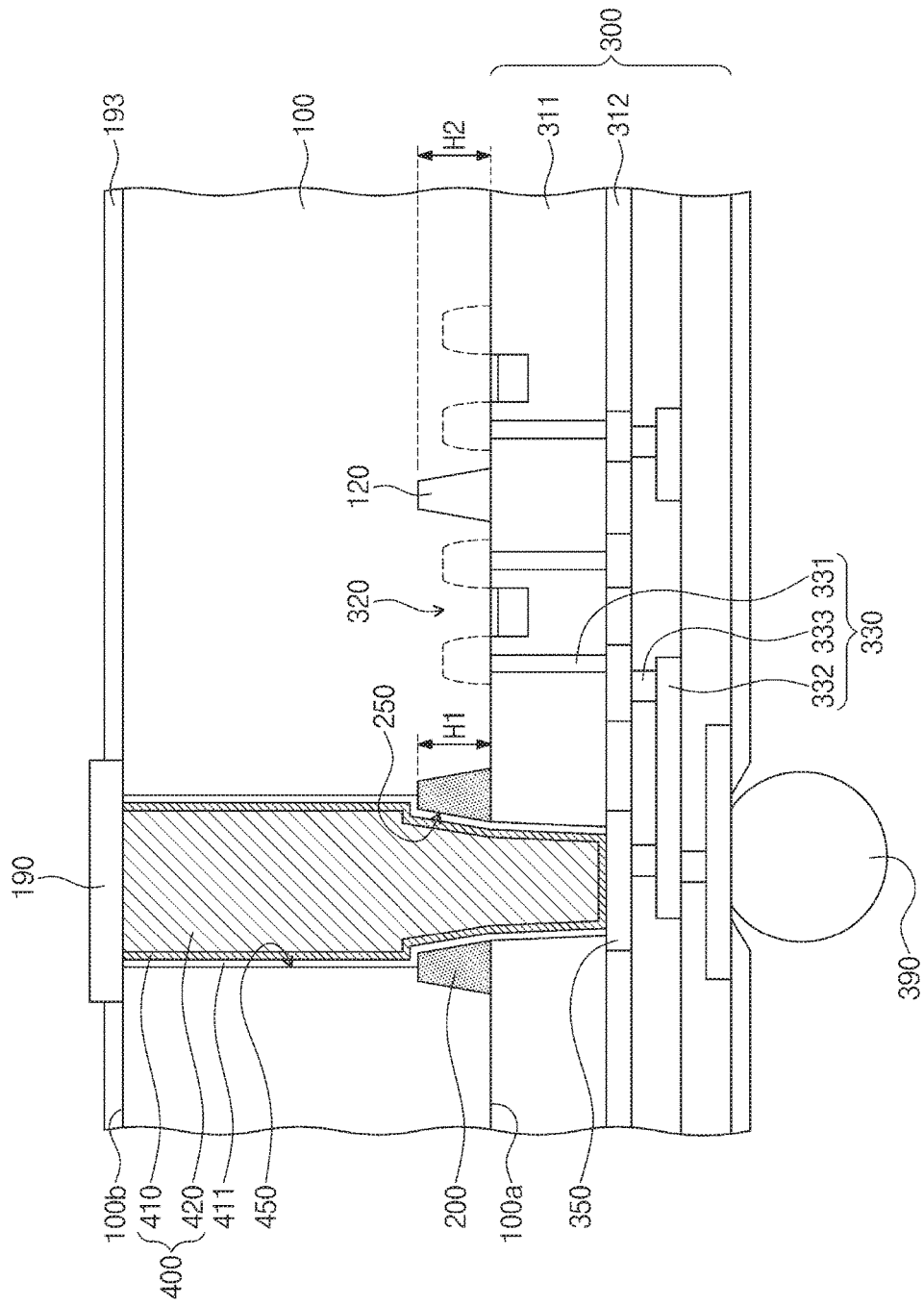
FIG. 7A is a sectional view illustrating a semiconductor device according to some example embodiments of the inventive concepts.

FIG. 7A is a sectional view illustrating a semiconductor device according to some example embodiments of the inventive concepts. For concise description, a previously described element may be identified by a similar or identical reference number without repeating an overlapping description thereof.

Referring to FIG. 7A, the semiconductor device may include the semiconductor substrate 100, the device isolation pattern 120, the etch stop pattern 200, the circuit layer 300, and the through via 400. The height H1 of the etch stop pattern 200 may be substantially equal to the height H2 of the device isolation pattern 120. The etch stop pattern 200 may be formed using the same process as that for the device isolation pattern 120, but the inventive concepts may not be limited thereto. As an example, the etch stop pattern 200 may be formed of or include the same material as that of the device isolation pattern 120.

Figure 7B:
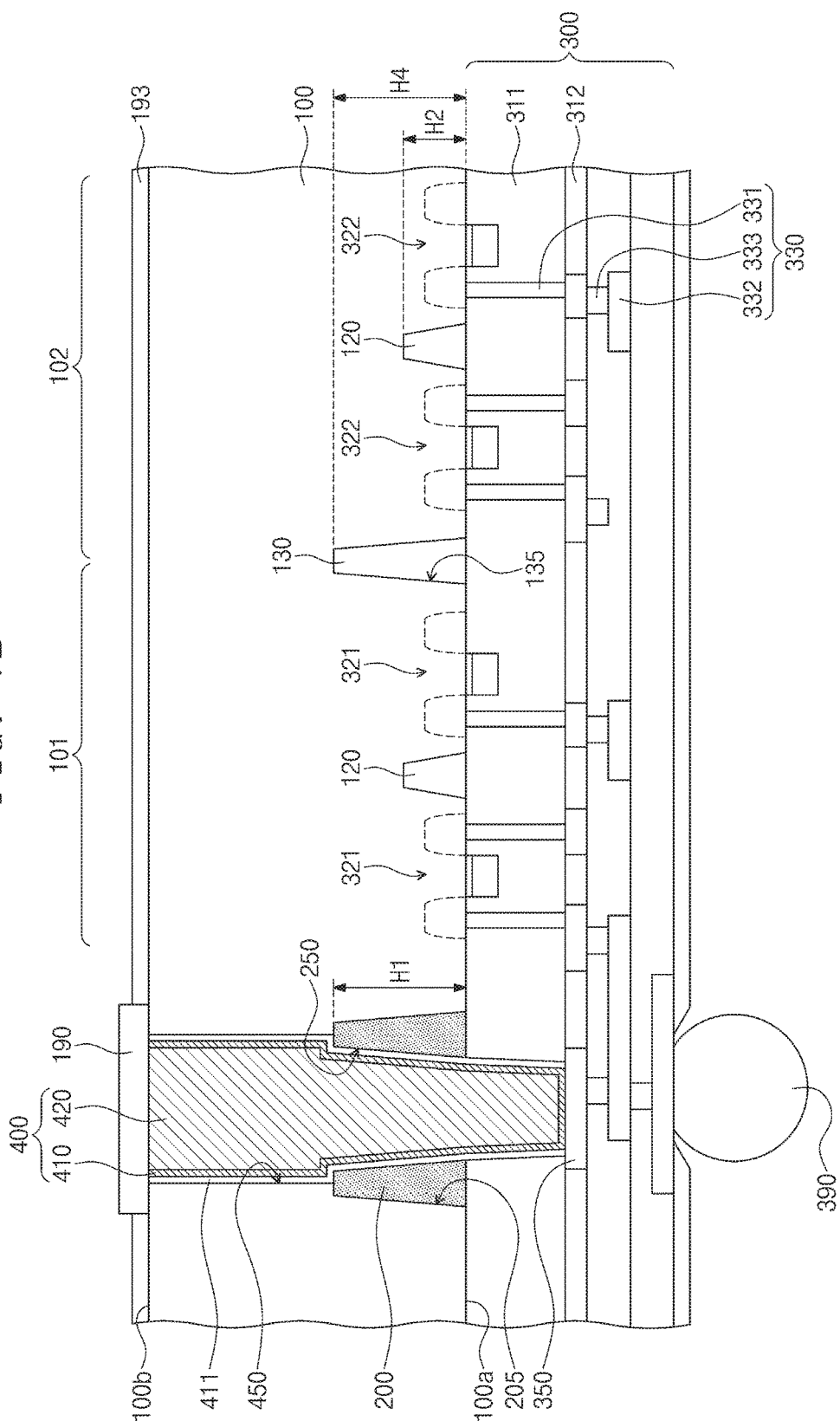
FIG. 7B is a sectional view illustrating a semiconductor device according to some example embodiments of the inventive concepts.

FIG. 7B is a sectional view illustrating a semiconductor device according to some example embodiments of the inventive concepts. For concise description, a previously described element may be identified by a similar or identical reference number without repeating an overlapping description thereof.

Referring to FIG. 7B, in addition to the semiconductor substrate 100, the device isolation pattern 120, the etch stop pattern 200, the circuit layer 300, and the through via 400, the semiconductor device may include a device isolation layer 130. The semiconductor substrate 100 may include a first region 101 and a second region 102. First transistors 321 may be provided on the first region 101. The first transistors 321 may have channels of a first conductivity type. Second transistors 322 may be provided on the second region 102. The second transistors 322 may have channels of a second conductivity type, where the first conductivity type is different from the second conductivity type. As an example, the first transistors 321 may be NMOS transistors, and the second transistors 322 may be PMOS transistors. The device isolation pattern 120 may be provided between the first transistors 321 and between the second transistors 322. The device isolation layer 130 may be provided between the first and second regions 101 and 102 of the semiconductor substrate 100. The device isolation layer 130 may include an insulating material that is formed to fill a second trench 135 in the semiconductor substrate 100. The first region 101 of the semiconductor substrate 100 may be separated from the second region 102 by the device isolation layer 130.

The etch stop pattern 200 may be provided in the semiconductor substrate 100. The height H1 of the etch stop pattern 200 may be substantially equal to a height H4 of the device isolation layer 130. The etch stop pattern 200 and the device isolation layer 130 may be formed by a single process. As an example, the first trench 205 and the second trench 135 may be formed at substantially the same time by a single etching process. The etch stop pattern 200 may include the same material as that of the device isolation layer 130, but the inventive concepts may not be limited thereto. In some example embodiments, the height H1 of the etch stop pattern 200 may be greater than the height H2 of the device isolation pattern 120.

Figure 8A:
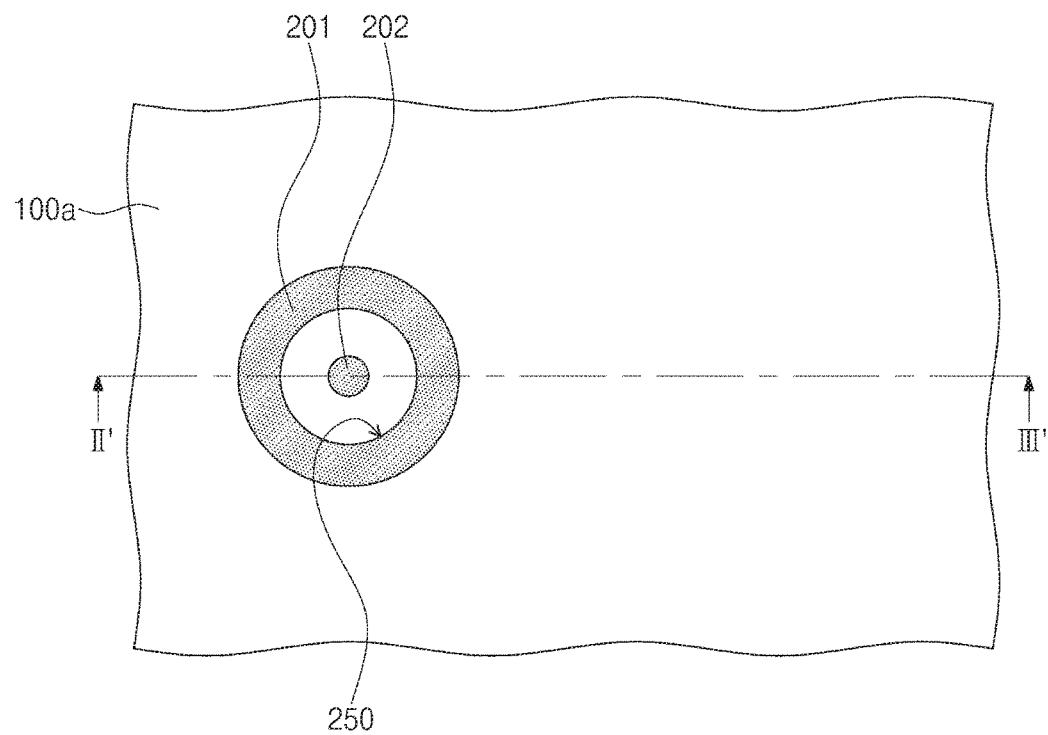
FIG. 8A is a plan view of an etch stop pattern, which is viewed from a first surface of a semiconductor substrate, according to some example embodiments of the inventive concepts.
Figure 8B:
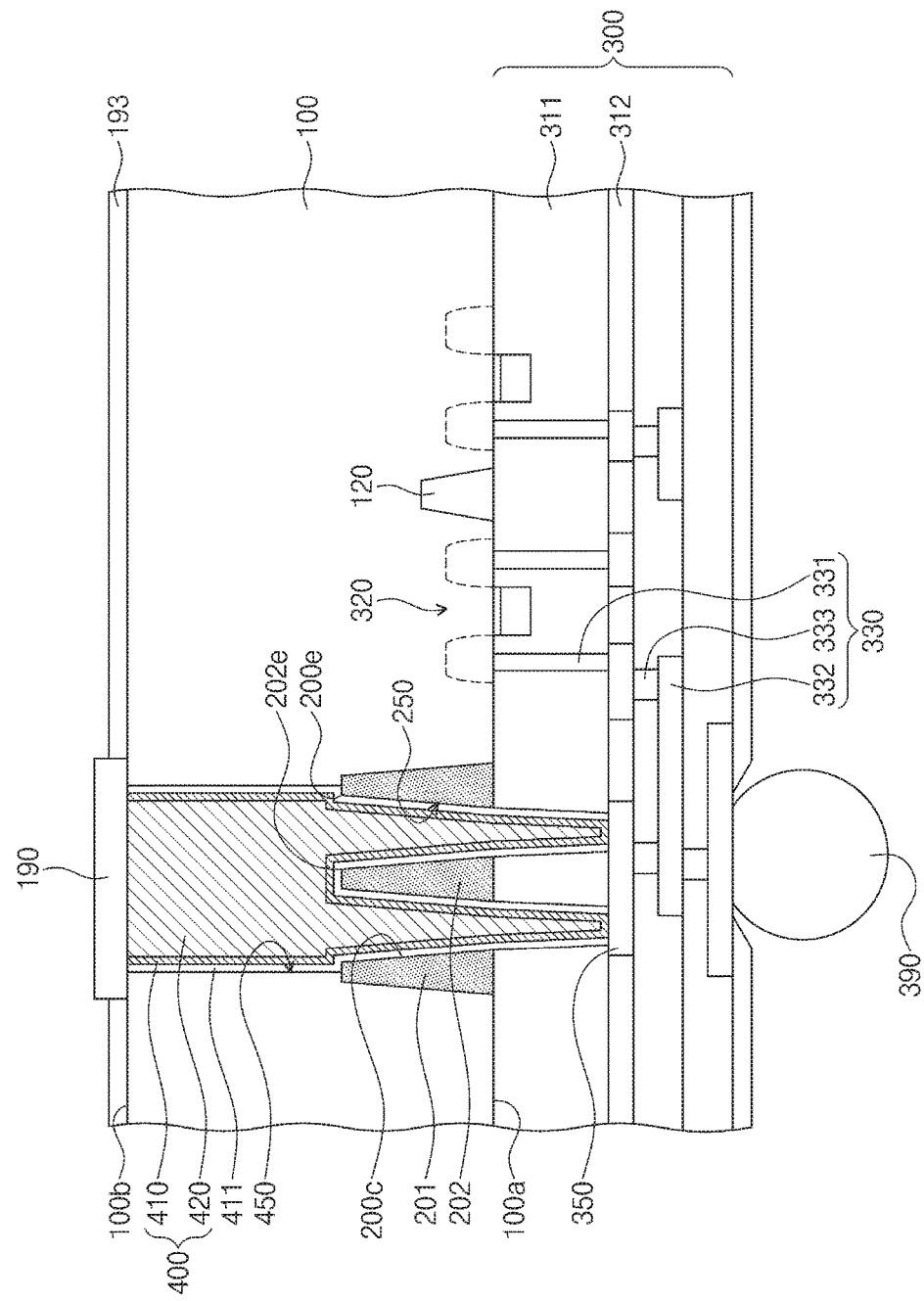
FIG. 8B is a section taken along line II'-III' of FIG. 8A.

FIG. 8A is a plan view of an etch stop pattern, which is viewed from a first surface of a semiconductor substrate, according to some example embodiments of the inventive concepts. FIG. 8B is a section taken along line II'-III' of FIG. 8A. For concise description, a previously described element may be identified by a similar or identical reference number without repeating an overlapping description thereof.

Referring to FIGS. 8A and 8B, the semiconductor device may include a first etch stop pattern 201 and a second etch stop pattern 202, in addition to the semiconductor substrate 100, the circuit layer 300, and the through via 400. The first etch stop pattern 201 may have substantially the same shape as the etch stop pattern 200 of FIG. 2 and may be formed using the same method as that described with reference to FIG. 3A. The first etch stop pattern 201 may have a closed-loop shape, when viewed in a plan view.

The second etch stop pattern 202 may be provided in the hole 250 of the first etch stop pattern 201. The second etch stop pattern 202 may be spaced apart from the first etch stop pattern 201. When viewed in a plan view, the second etch stop pattern 202 may have a circular shape, but the inventive concepts may not be limited thereto. For example, the second etch stop pattern 202 may have an elliptical or polygonal shape. The second etch stop pattern 202 may have an etch selectivity with respect to the semiconductor substrate 100. For example, the second etch stop pattern 202 may be formed of or include at least one of silicon oxide, silicon nitride, silicon oxynitride, or low-k dielectric materials. The second etch stop pattern 202 may include the same material as that of the first etch stop pattern 201, but the inventive concepts may not be limited thereto.

The through hole 450 may be provided to penetrate the semiconductor substrate 100 and may extend into the hole 250 of the first etch stop pattern 201. The through hole 450 may be provided between the first and second etch stop patterns 201 and 202. In some example embodiments, the through hole 450 may be provided to penetrate the first insulating layer 311 and expose the via pad 350. The through hole 450 may be formed using the same method as that described with reference to FIGS. 3B and 3C. Although not shown, the etching of the first insulating layer 311 may be performed to partially etch not only the inner side surface 200c of the first etch stop pattern 201 but also the second etch stop pattern 202, and thus, the first edge 200e of the first etch stop pattern 201 and an edge 202e of the second etch stop pattern 202 may be rounded.

The liner layer 411 may be formed to cover the side surface of the through hole 450, but the via pad 350 may include at least a portion that is not covered with the liner layer 411. The through via 400 may be formed on the liner layer 411 to fill the through hole 450. The through via 400 may extend between the first etch stop pattern 201 and the second etch stop pattern 202. The barrier pattern 410 may be provided between the conductive pattern 420 and the liner layer 411.

Figure 8C:
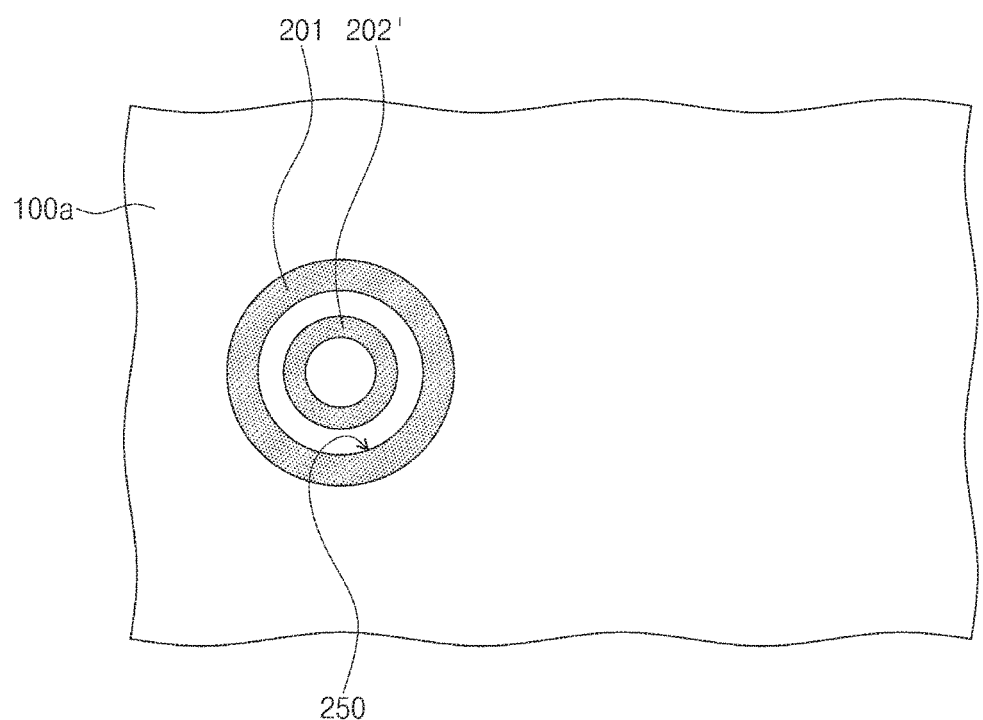
FIGS. 8C and 8D are plan views of etch stop patterns, which are viewed from a first surface of a semiconductor substrate, according to some example embodiments of the inventive concepts.
Figure 8D:
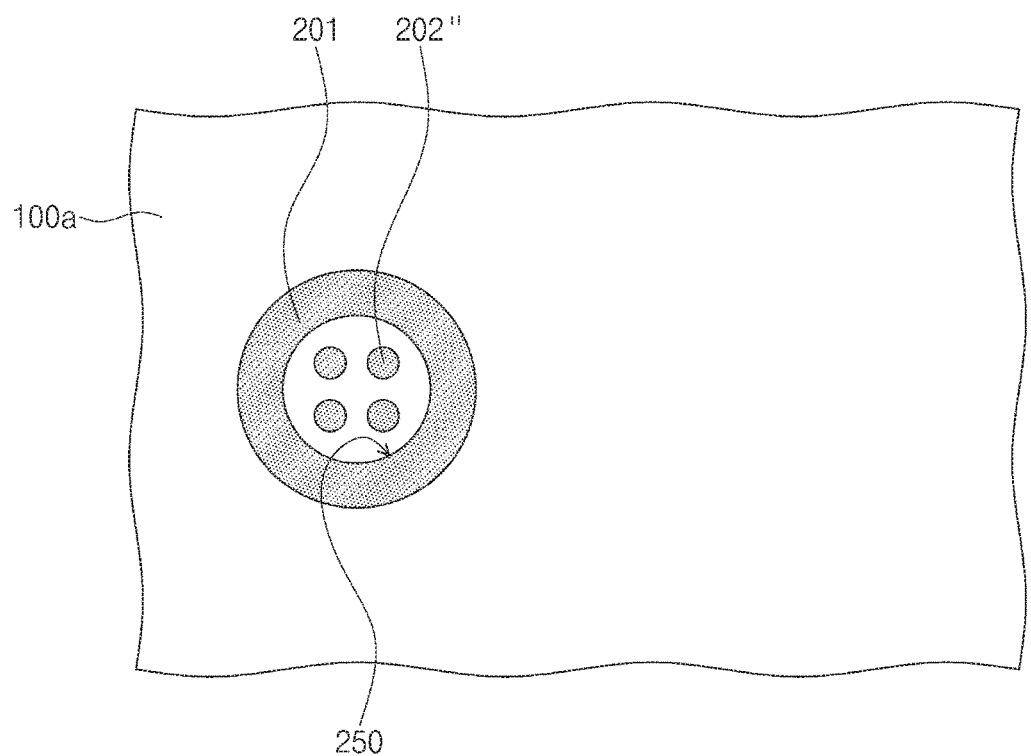

FIGS. 8C and 8D are plan views of etch stop patterns, which are viewed from a first surface of a semiconductor substrate, according to some example embodiments of the inventive concepts. For concise description, a previously described element may be identified by a similar or identical reference number without repeating an overlapping description thereof.

Referring to FIG. 8C, the first etch stop pattern 201 may have substantially the same shape as the etch stop pattern 200 of FIG. 2 and may be formed using the same method as that described with reference to FIG. 3A. A second etch stop pattern 202' may be provided in the hole 250 of the first etch stop pattern 201 and may be spaced apart from the first etch stop pattern 201. The second etch stop pattern 202' may have a closed-loop shape. Although not shown, the through via 400 may be provided in a hole 250 of the second etch stop pattern 202' and between the first and second etch stop patterns 201 and 202'.

Referring to FIG. 8D, the first etch stop pattern 201 may have substantially the same shape as the etch stop pattern 200 of FIG. 2 and may be formed using the same method as that described with reference to FIG. 3A. A plurality of second etch stop patterns 202" may be formed in the hole 250 of the first etch stop pattern 201. Although each of the second etch stop patterns 202" is illustrated to have a circular shape, the inventive concepts may not be limited thereto.

FIGS. 9A to 9D are sectional views illustrating a method of fabricating a semiconductor device, according to some example embodiments of the inventive concepts. For example, FIGS. 9A to 9D are enlarged sectional views, each of which is taken along line II-III of FIG. 2 and illustrates the region I of FIG. 1. For concise description, a previously described element may be identified by a similar or identical reference number without repeating an overlapping description thereof.

Figure 9A:
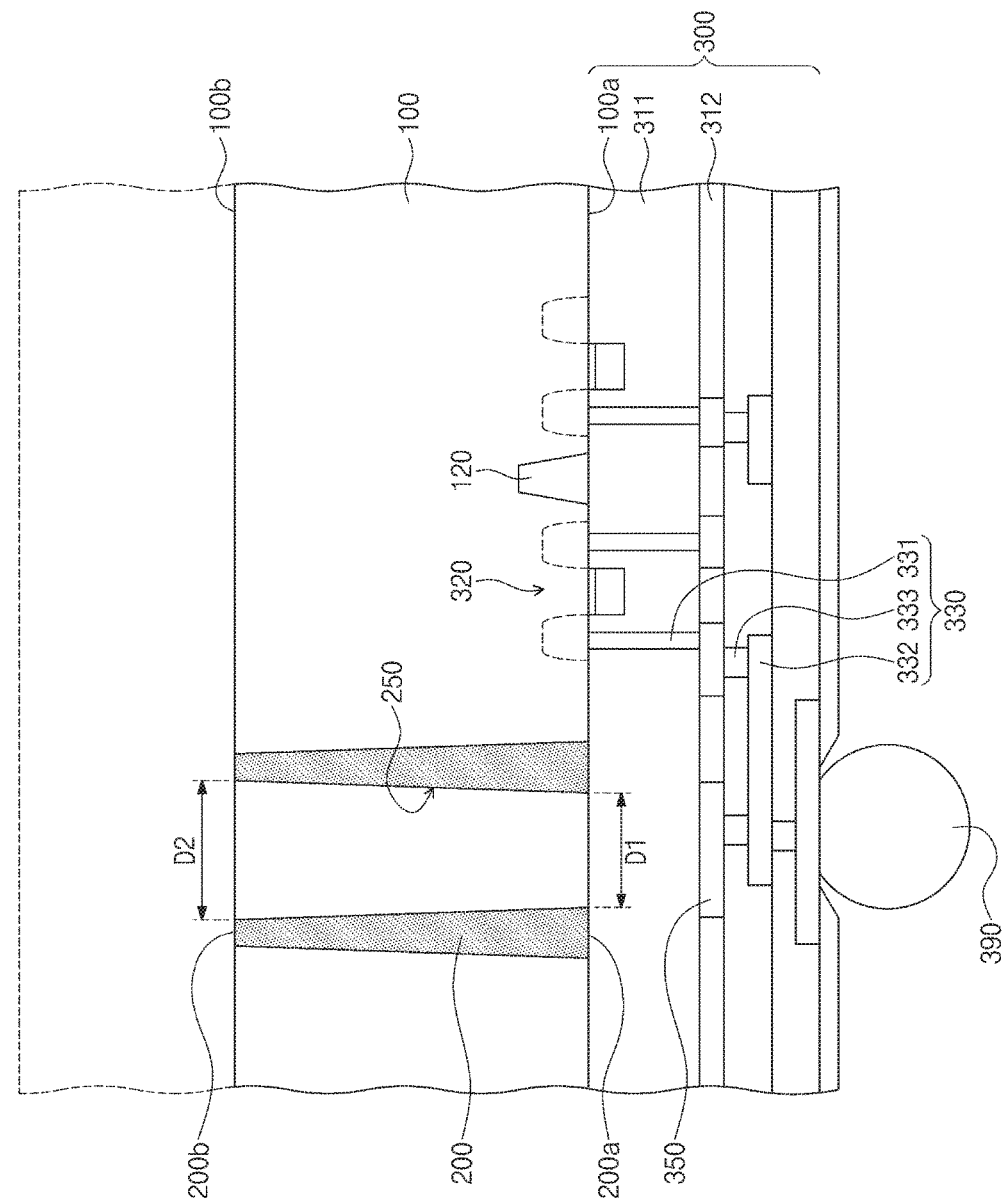
FIGS. 9A to 9D are sectional views illustrating a method of fabricating a semiconductor device, according to some example embodiments of the inventive concepts.

Referring to FIGS. 2 and 9A, the semiconductor substrate 100 may be provided. The semiconductor substrate 100 may include the device isolation pattern 120 and the etch stop pattern 200. The etch stop pattern 200 may be formed to have a height greater than the height H1 of the etch stop pattern 200 described with reference to FIG. 2A. The circuit layer 300 may be formed on the first surface 100a of the semiconductor substrate 100. The circuit layer 300 may include the first insulating layer 311, the second insulating layers 312, the transistors 320, the via pad 350, and the interconnection structure 330. The connection terminal 390 may be formed on the bottom surface of the circuit layer 300.

As illustrated by a dotted line, a polishing or grinding process may be performed on the second surface 100b of the semiconductor substrate 100 to thin the semiconductor substrate 100. Here, the thinning of the semiconductor substrate 100 may be performed to expose the etch stop pattern 200. The top surface 200b of the etch stop pattern 200 may be coplanar with the second surface 100b of the semiconductor substrate 100. The etch stop pattern 200 may be formed to penetrate the semiconductor substrate 100.

Figure 9B:
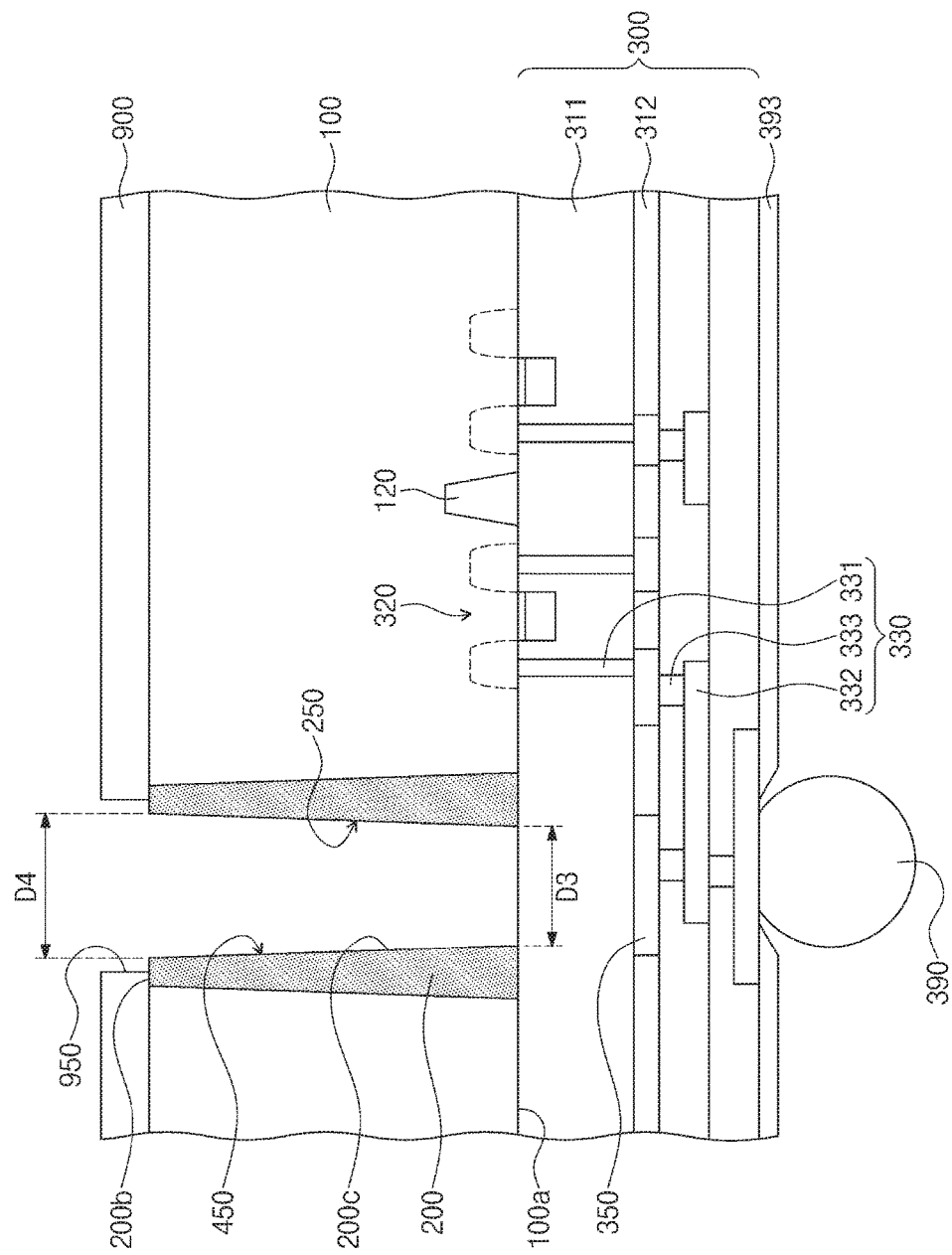

Referring to FIGS. 2 and 9B, the mask pattern 900 may be formed on the second surface 100b of the semiconductor substrate 100. The opening 950 of the mask pattern 900 may be formed to expose the semiconductor substrate 100 through the hole 250 and expose the top surface 200b of the etch stop pattern 200. In some example embodiments, the opening 950 of the mask pattern 900 may be aligned to the hole 250 of the etch stop pattern 200. The semiconductor substrate 100 exposed through the hole 250 of the etch stop pattern 200 may be etched to form the through hole 450 in the semiconductor substrate 100. The through hole 450 may include, or be the same as, the hole 250 of the etch stop pattern 200. The through hole 450 may expose the etch stop pattern 200 but not the semiconductor substrate 100. In the process of etching the semiconductor substrate 100, the etch stop pattern 200 may reduce or prevent a recess region (e.g., 470 of FIG. 4A) from being formed in the through hole 450.

A diameter D3 of the through hole 450 at or near the level of the first surface 100a may be smaller than a diameter D4 of the through hole 450 at or near the level of the second surface 100b. The through hole 450 may be formed to have a diameter decreasing in a direction toward the first surface 100a of the semiconductor substrate 100.

Figure 9C:
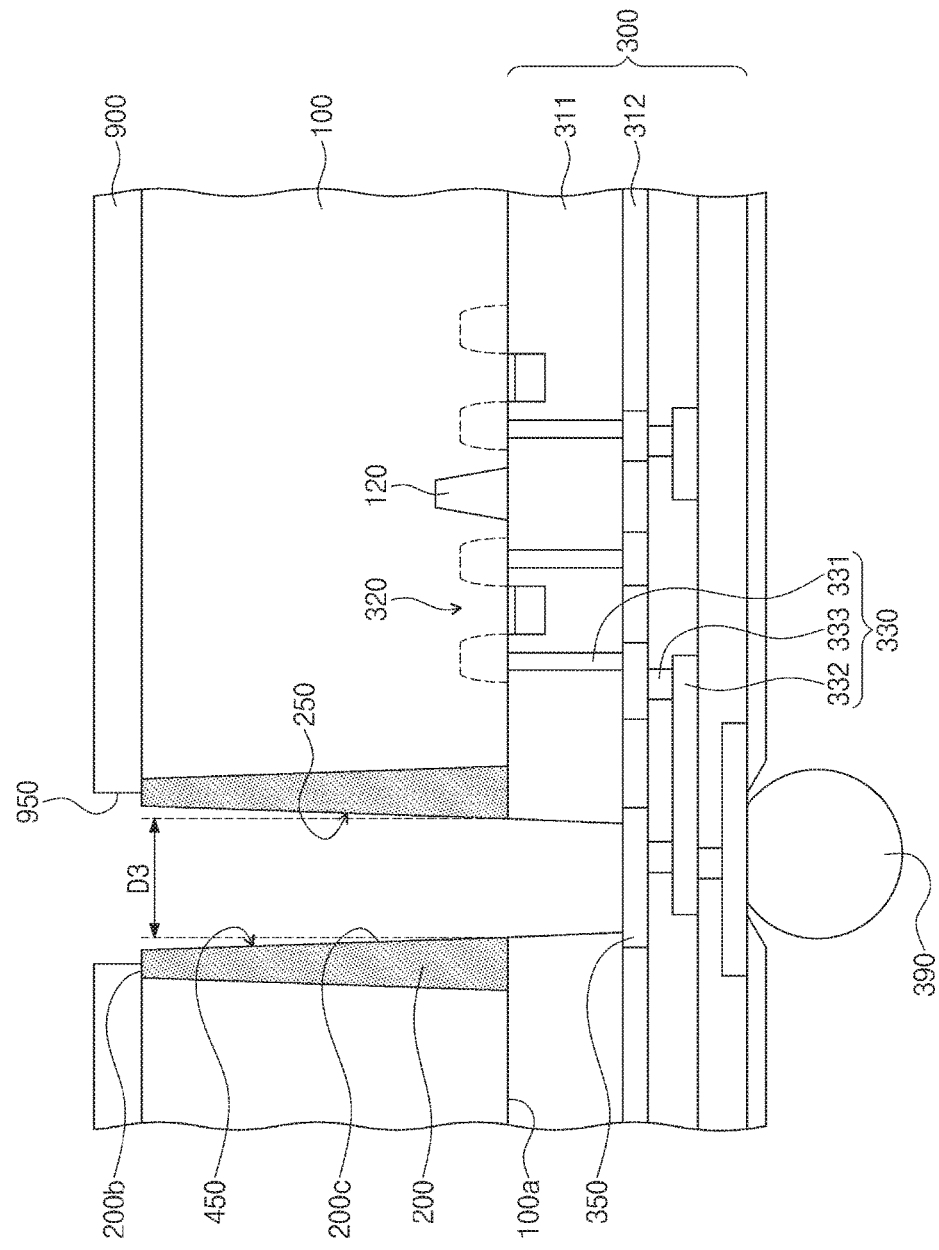

Referring to FIGS. 2 and 9C, the first insulating layer 311 may be etched to expand the through hole 450 into the first insulating layer 311. A diameter of the through hole 450 in the first insulating layer 311 may be equal to or smaller than the diameter D3 of the through hole 450 at or near the level of the first surface 100a. This may make it possible to reduce a width of the via pad 350 and consequently to increase a degree of freedom in disposing the interconnection structure 330. For example, even when there is a process error in a position of the opening 950, the through hole 450 may be normally formed. In particular, even when the opening 950 of the mask pattern 900 is not aligned to the hole 250 of the etch stop pattern 200 or is formed to excessively expose the top surface 200b of the etch stop pattern 200, it may be possible to form the through hole 450 normally exposing the via pad 350. Thereafter, the mask pattern 900 may be removed.

Figure 9D:
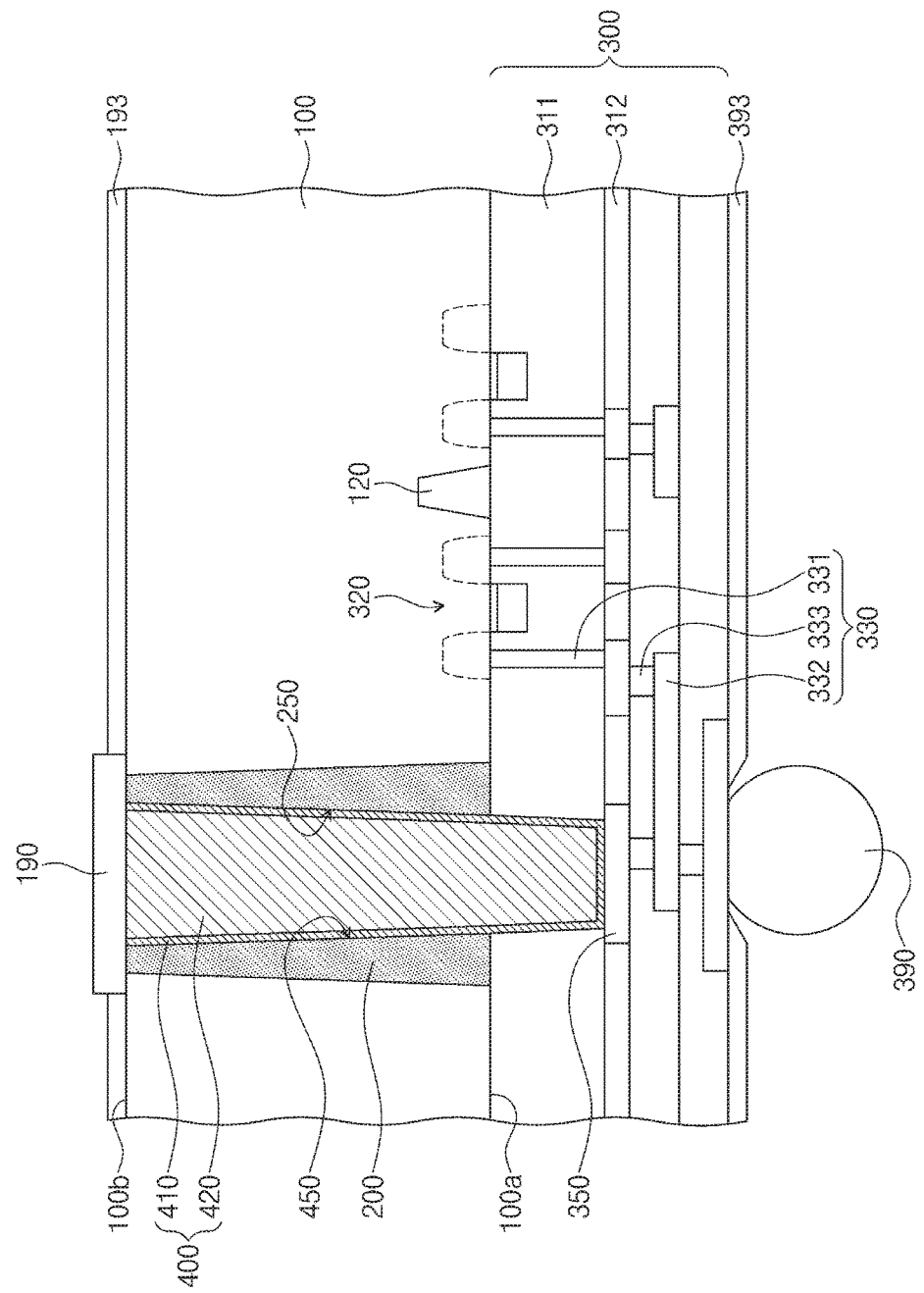

Referring to FIG. 9D, the through via 400 may be formed in the through hole 450. The etch stop pattern 200 may surround a portion of a lateral surface of the through hole 450. The etch stop pattern 200 may be formed of or include an insulating material. Accordingly, it may be possible to omit a process of forming the liner layer 411 and consequently to simplify a process of fabricating a semiconductor device. The barrier pattern 410 may be formed to be in direct contact with the etch stop pattern 200 and to cover a top surface of the via pad 350. The conductive pattern 420 may be formed on the barrier pattern 410 to fill the through hole 450. The through via 400 may be formed using substantially the same method as that described with reference to FIG. 3E. The second protection layer 193 and the connection pad 190 may be formed on the second surface 100b of the semiconductor substrate 100.

Figure 10:
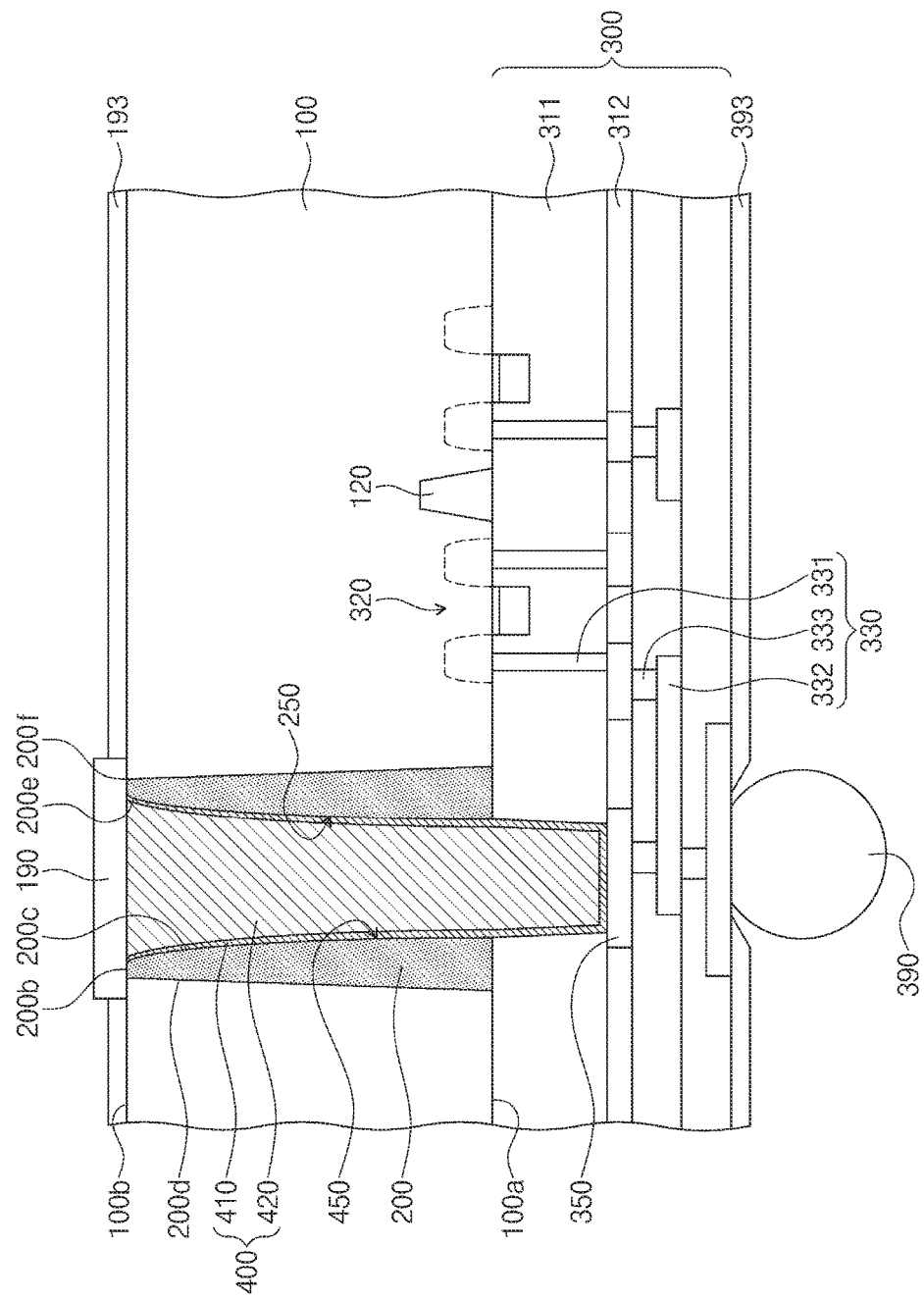
FIG. 10 is a sectional view illustrating a semiconductor device according to some example embodiments of the inventive concepts.

FIG. 10 is a sectional view illustrating a semiconductor device according to some example embodiments of the inventive concepts. For concise description, a previously described element may be identified by a similar or identical reference number without repeating an overlapping description thereof.

Referring to FIG. 10 in conjunction with FIG. 1, the semiconductor device may include the semiconductor substrate 100, the circuit layer 300, the etch stop pattern 200, and the through via 400. The semiconductor device may be formed using the same method as that described with reference to FIGS. 9A and 9B.

In the process of forming the through hole 450, the top and inner side surfaces 200b and 200c of the etch stop pattern 200 exposed by the opening 950 may be etched along with the first insulating layer 311. Accordingly, the first edge 200e of the etch stop pattern 200 may have a more rounded profile, compared to that of the second edge 200f. Also, the inner side surface 200c of the etch stop pattern 200 may have a more rounded profile, compared to that of the outer side surface 200d.

Figure 11A:
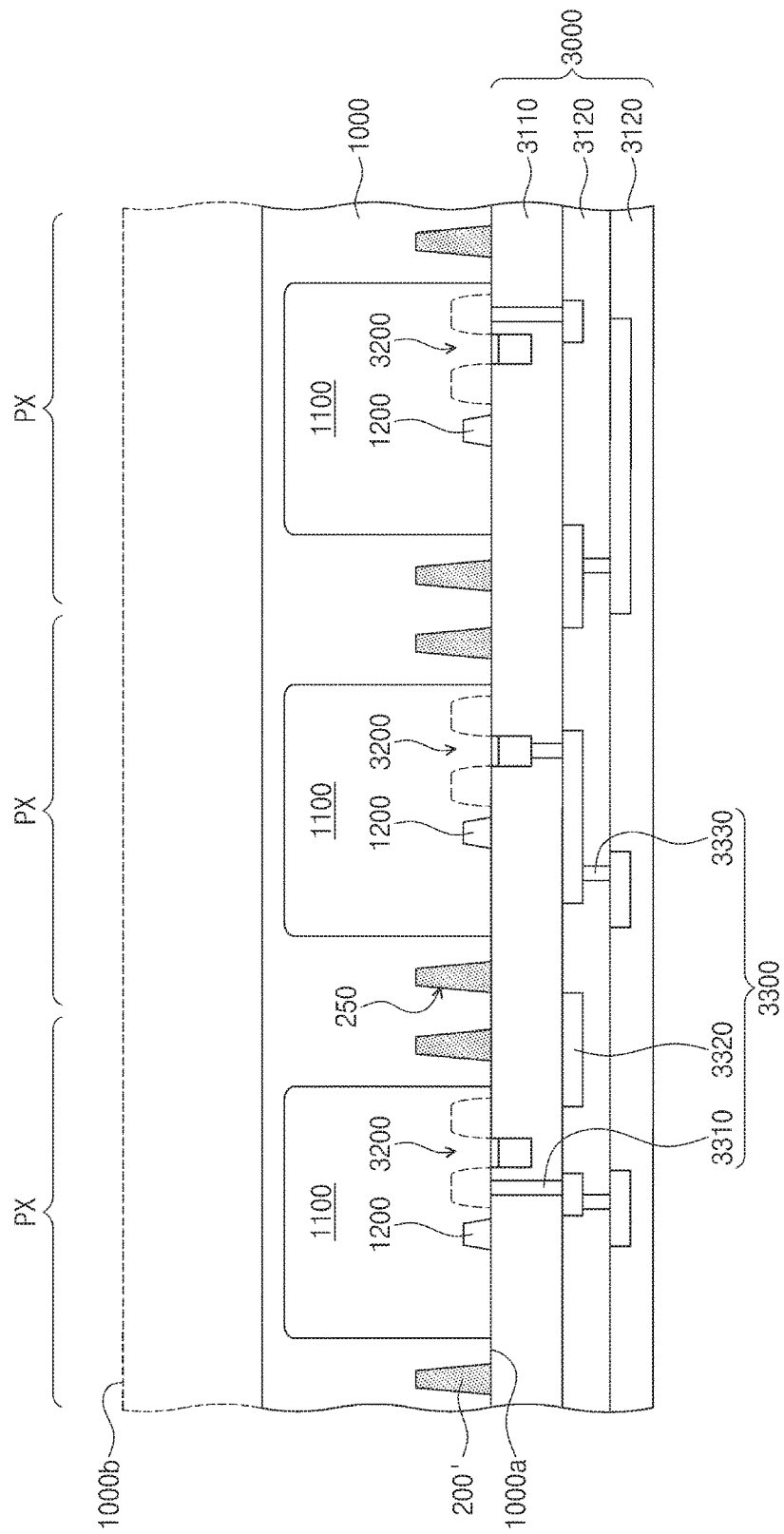
FIGS. 11A to 11C are sectional views illustrating a method of fabricating a semiconductor device, according to some example embodiments of the inventive concepts.
Figure 11B:
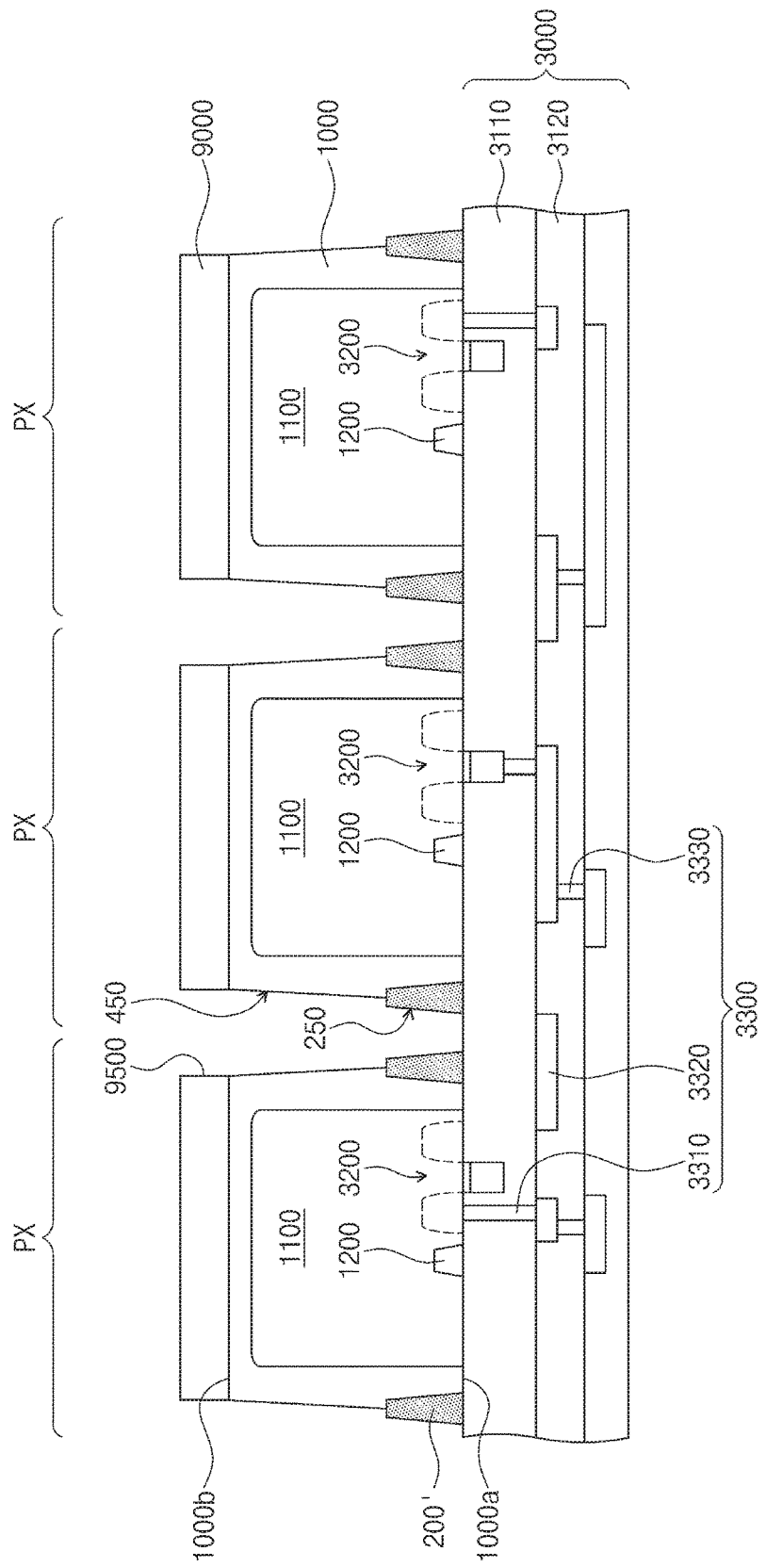
Figure 11C:
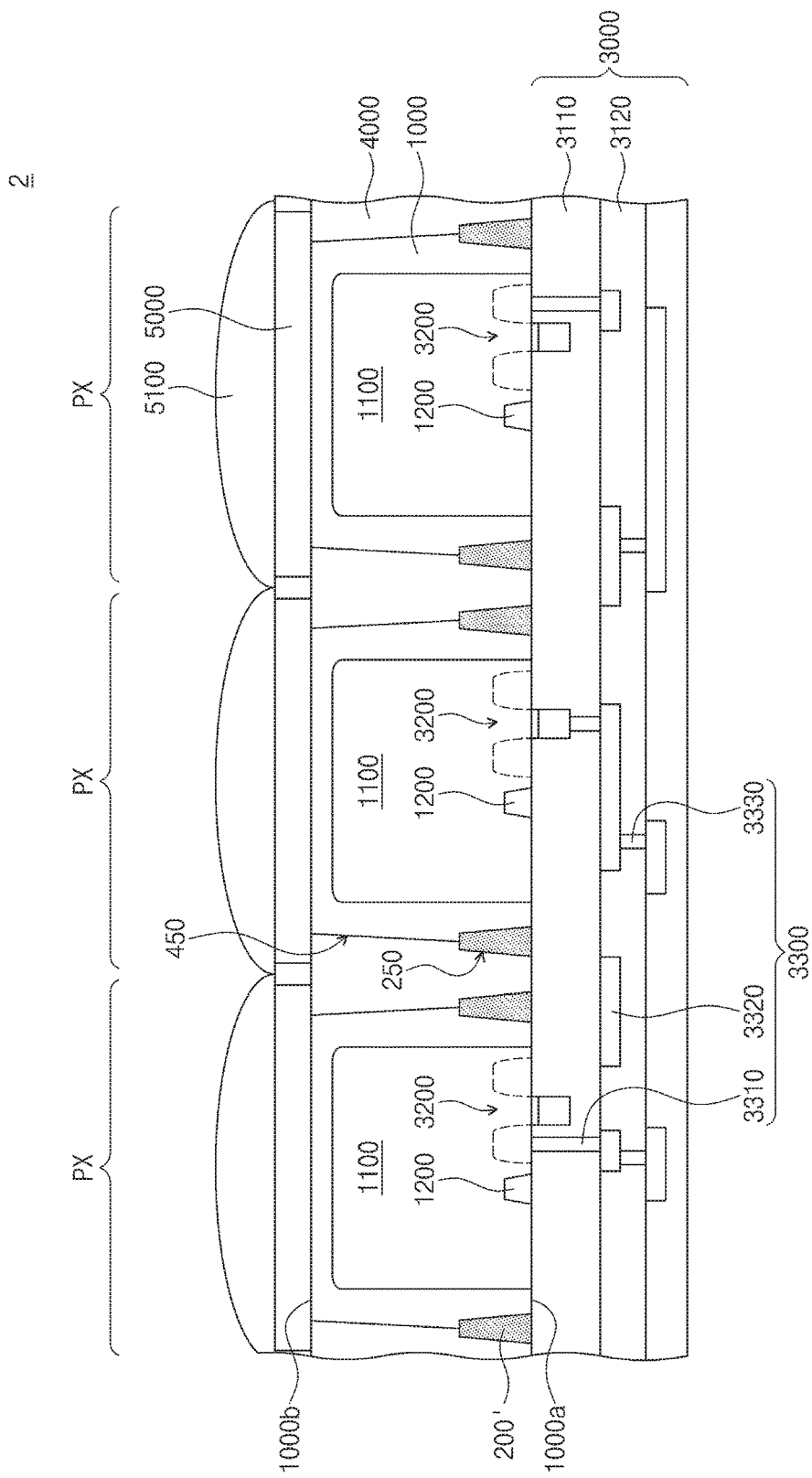

FIGS. 11A to 11C are sectional views illustrating a method of fabricating a semiconductor device, according to some example embodiments of the inventive concepts. For concise description, a previously described element may be identified by a similar or identical reference number without repeating an overlapping description thereof.

Referring to FIG. 11A, a semiconductor substrate 1000 may include an etch stop pattern 200', a device isolation pattern 1200, and photoelectric conversion regions 1100. The etch stop pattern 200' may be formed to have the hole 250 penetrating therethrough. As shown in FIG. 2, the etch stop pattern 200' between the photoelectric conversion regions 1100 may have a closed-loop shaped section. The etch stop pattern 200' and the device isolation pattern 1200 may be formed using substantially the same method as that for forming the etch stop pattern 200 and the device isolation pattern 120 described with reference to FIG. 3A. The etch stop pattern 200' may have a height larger than that of the device isolation pattern 1200. Although not shown, the etch stop pattern 200' may be formed to have the same height as that of the device isolation pattern 1200 and may be formed using the same process as that for the device isolation pattern 1200.

The semiconductor substrate 1000 may include a plurality of pixel regions PX. The semiconductor substrate 1000 may contain impurities of a second conductivity type. Impurities of a first conductivity type may be injected into a first surface 1000a of the semiconductor substrate 1000 to form the photoelectric conversion regions 1100 in the pixel regions PX, respectively. In some example embodiments, the first conductivity type may be an n type, and the second conductivity type may be a p type. The photoelectric conversion regions 1100 may be configured to generated electron-hole pairs from an incident light, and electrons and/or holes may be used to produce electrical signals. The photoelectric conversion regions 1100 are illustrated to be spaced apart from each other, but in some example embodiments, they may be connected to each other. In some example embodiments, a plurality of photoelectric conversion regions 1100 may be provided in at least one of the pixel regions PX.

A circuit layer 3000 may be formed on a second surface 1000b of the semiconductor substrate 1000. The circuit layer 3000 may include a first insulating layer 3110, second insulating layers 3120, transistors 3200, and an interconnection structure 3300. The interconnection structure 3300 may include a contact plug 3310, a metal pattern 3320, and a metal via 3330. Unlike that illustrated in FIG. 3A, the via pad 350 may not be formed.

Thereafter, a polishing or grinding process may be performed on the second surface 1000b of the semiconductor substrate 1000 to thin the semiconductor substrate 1000.

Referring to FIG. 11B, the through hole 450 may be formed in the semiconductor substrate 1000. For example, the mask pattern 900 may be formed on the second surface 1000b of the semiconductor substrate 1000. The semiconductor substrate 1000 exposed by the mask pattern 900 may be etched to form the through hole 450. The through hole 450 may be formed to extend in the hole 250 of the etch stop pattern 200' and thereby to expose the etch stop pattern 200' and the first insulating layer 3110. The etch stop pattern 200' may be formed to surround a portion of a lateral surface of the through hole 450. Owing to the etch stop pattern 200', it may be possible to reduce or prevent a recess region (e.g., 470 of FIG. 4A) from being formed.

Referring to FIG. 11C, an isolation structure 4000 may be formed by forming an insulating material filling the through hole 450. The isolation structure 4000 may define the pixel regions PX. The isolation structure 4000 may have a refractive index lower than that of the semiconductor substrate 1000, and this may make it possible to reduce a cross talk between the pixel regions PX. The isolation structure 4000 may be formed of or include at least one of silicon oxide, silicon nitride, silicon oxynitride, or low-k dielectric materials. Color filters 5000 and micro lenses 5100 may be formed on the second surface 1000b of the semiconductor substrate 1000. The color filter 5000 and the micro lens 5100 may be formed on each of the pixel regions PX. As a result of the above processes, a semiconductor device 2 may be formed.

According to some example embodiments of the inventive concepts, an etch stop pattern may be formed to reduce or prevent a recess region from being formed in a through hole during an etching process. The reduction or prevention of the formation of the recess region may make it possible to reduce or prevent a void from being formed between the through via and a semiconductor substrate, when a through via is formed in the through hole. As a result, realizing a reliable semiconductor device is possible.

The etch stop pattern may lead to a reduction in a bottom diameter of the through hole. Accordingly, a via pad is formed to have a reduced width, thereby allowing a process of disposing an interconnection structure with an increased degree of freedom. Even when there is a process error in a process of forming an opening or a through via, the formation of the etch stop pattern may make it possible to properly form a through hole.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a semiconductor substrate having first and second surfaces facing each other;
   an etch stop pattern in a trench formed in the first surface of the semiconductor substrate;
   a first insulating layer on the first surface of the semiconductor substrate; and
   a through via penetrating the semiconductor substrate and the first insulating layer, the etch stop pattern surrounding a portion of a lateral surface of the through via, wherein
   the through via is in a through hole,
   the through hole extends into a pattern hole defined by the etch stop pattern,
   the etch stop pattern includes at least one edge defined by top and side surfaces thereof,
   the at least one edge includes a first edge exposed by the pattern hole and a second edge covered with the semiconductor substrate, and
   the first edge has a more rounded profile than a profile of the second edge.

2. The device of claim 1, wherein
   the through via includes first and second portions, the first portion surrounded by the etch stop pattern and the second portion surrounded by the semiconductor substrate,
   the second portion of the through via includes a plurality of convex portions, each of the convex portions protruding toward the semiconductor substrate,
   the second portion is connected to the first portion, and
   the first portion is closer to the first surface of the semiconductor substrate than the second portion.

3. The device of claim 1, further comprising:
   a device isolation pattern in the semiconductor substrate,
   wherein a depth of the etch stop pattern is greater than a depth of the device isolation pattern.

4. The device of claim 1, wherein the etch stop pattern comprises:
   a bottom surface coplanar with the first surface of the semiconductor substrate; and
   a top surface facing the bottom surface,
   wherein a diameter of the pattern hole is smaller at a level of the bottom surface of the etch stop pattern than at a level of the top surface of the etch stop pattern.

5. The device of claim 1, further comprising:
   a liner layer between the through via and the semiconductor substrate and between the through via and the etch stop pattern.

6. The device of claim 1, wherein the etch stop pattern is configured to penetrate the semiconductor substrate.

7. A semiconductor device, comprising:
a semiconductor layer;
an etch stop pattern penetrating the semiconductor layer;
a through via in a hole defined by the etch stop pattern, the through via having a portion of a lateral surface surrounded by the etch stop pattern; and
a circuit layer on a surface of the semiconductor layer, the circuit layer covering the etch stop pattern, wherein
the etch stop pattern includes at least one edge defined by top and side surfaces thereof,
the edge includes a first edge exposed by the hole and a second edge covered with the semiconductor layer, and
the first edge has a more rounded profile than a profile of the second edge.

8. The device of claim 7, wherein the through via fills the hole and is in physical contact with the etch stop pattern.

9. The device of claim 7, wherein the etch stop pattern comprises:
an inner side surface facing the through via; and
an outer side surface facing the semiconductor layer,
wherein the inner side surface has a more rounded profile than a profile of the outer side surface.

10. The device of claim 7, wherein
the circuit layer includes a via pad therein, and
the through via penetrates at least a portion of the circuit layer and is coupled to the via pad.

11. A semiconductor device, comprising:
an etch stop pattern in a semiconductor substrate; and
a through via penetrating the semiconductor substrate and extending into the etch stop pattern, the through via having the etch stop pattern along sidewalls of a lower portion of the through via, wherein
the etch stop pattern includes at least one edge defined by top and side surfaces thereof,
the edge includes a first edge exposed by a hole in the etch stop pattern and a second edge covered with the semiconductor substrate, and
the first edge has a more rounded profile than a profile of the second edge.

12. The device of claim 11, wherein
the semiconductor substrate is along sidewalls of an upper portion of the through via,
the upper portion of the through via includes a plurality of convex portions, each of the convex portions protruding toward the semiconductor substrate, and
the upper portion is connected to the lower portion.

13. The device of claim 11, further comprising:
a device isolation pattern in the semiconductor substrate,
wherein a depth of the etch stop pattern is greater than a depth of the device isolation pattern.

14. The device of claim 11, further comprising:
a liner layer between the through via and the semiconductor substrate and between the through via and the etch stop pattern.

15. The device of claim 11, wherein the through via is in physical contact with the etch stop pattern.

* * * * *